(12) United States Patent
Cheng et al.

(10) Patent No.: US 11,031,299 B2
(45) Date of Patent: Jun. 8, 2021

(54) FINFET DEVICE WITH DIFFERENT LINERS FOR PFET AND NFET AND METHOD OF FABRICATING THEREOF

(71) Applicant: Taiwan Semiconductor Manufacturing Co., Ltd., Hsinchu (TW)

(72) Inventors: Ming-Lung Cheng, Kaohsiung County (TW); Yen-Chun Lin, Hsinchu (TW); Da-Wen Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 103 days.

(21) Appl. No.: 16/045,992

(22) Filed: Jul. 26, 2018

(65) Prior Publication Data

US 2018/0350697 A1    Dec. 6, 2018

Related U.S. Application Data

(62) Division of application No. 15/725,544, filed on Oct. 5, 2017, now Pat. No. 10,522,417.
(Continued)

(51) Int. Cl.
*H01L 21/8238*    (2006.01)
*H01L 27/092*    (2006.01)
(Continued)

(52) U.S. Cl.
CPC .......... *H01L 21/823821* (2013.01); *H01L 21/823481* (2013.01); *H01L 21/823807* (2013.01);
(Continued)

(58) Field of Classification Search
None
See application file for complete search history.

(56) References Cited

U.S. PATENT DOCUMENTS 7,425,740 B2    9/2008  Liu et al.
7,667,271 B2    2/2010  Yu et al.
(Continued)

FOREIGN PATENT DOCUMENTS

CN    103811346 A    5/2014
KR    20160103424 A    9/2016
KR    20170030004 A    3/2017

OTHER PUBLICATIONS

Saint-Cast, Pierre, et al., "Very Low Surface Recombination Velocity on p-type c-Si by High-Rate Plasma-Deposited Aluminum Oxide", Applied Physics Letters, vol. 95, No. 151502, (2009), 3 pgs.
(Continued)

*Primary Examiner* — Nilufa Rahim
(74) *Attorney, Agent, or Firm* — Haynes and Boone, LLP

(57) ABSTRACT

A semiconductor device includes a P-type Field Effect Transistor (PFET) and an NFET. The PFET includes an N-well disposed in a substrate, a first fin structure disposed over the N-well, a first liner layer disposed over the N-well, and a second liner layer disposed over the first liner layer. The first liner layer and the second liner layer include different materials. The NFET includes a P-well disposed in the substrate, a second fin structure disposed over the P-well, a third liner layer disposed over the P-well. The third liner layer and the second liner layer include the same materials.

20 Claims, 18 Drawing Sheets

Related U.S. Application Data

(60) Provisional application No. 62/490,839, filed on Apr. 27, 2017.

(51) Int. Cl.
  H01L 29/78 (2006.01)
  H01L 29/10 (2006.01)
  H01L 21/8234 (2006.01)
  H01L 21/02 (2006.01)
  H01L 21/311 (2006.01)

(52) U.S. Cl.
  CPC .. H01L 21/823878 (2013.01); H01L 27/0924 (2013.01); H01L 29/1054 (2013.01); H01L 29/7843 (2013.01); H01L 29/7846 (2013.01); H01L 21/0217 (2013.01); H01L 21/02164 (2013.01); H01L 21/02271 (2013.01); H01L 21/31105 (2013.01); H01L 21/31144 (2013.01); H01L 21/823892 (2013.01); H01L 27/0928 (2013.01)

(56) References Cited

U.S. PATENT DOCUMENTS

| | | | |
|---|---|---|---|
| 7,910,453 B2 | 3/2011 | Xu et al. |
| 8,048,723 B2 | 11/2011 | Chang et al. |
| 8,053,299 B2 | 11/2011 | Xu |
| 8,183,627 B2 | 5/2012 | Currie |
| 8,362,575 B2 | 1/2013 | Kwok et al. |
| 8,367,498 B2 | 2/2013 | Chang et al. |
| 8,377,779 B1 | 2/2013 | Wang |
| 8,399,931 B2 | 3/2013 | Liaw et al. |
| 8,415,718 B2 | 4/2013 | Xu |
| 8,440,517 B2 | 5/2013 | Lin et al. |
| 8,487,378 B2 | 7/2013 | Goto et al. |
| 8,497,177 B1 | 7/2013 | Chang et al. |
| 8,497,528 B2 | 7/2013 | Lee et al. |
| 8,609,518 B2 | 12/2013 | Wann et al. |
| 8,610,240 B2 | 12/2013 | Lee et al. |
| 8,618,556 B2 | 12/2013 | Wu et al. |
| 8,633,516 B1 | 1/2014 | Wu et al. |
| 8,652,894 B2 | 2/2014 | Lin et al. |
| 8,680,576 B2 | 3/2014 | Ching et al. |
| 8,686,516 B2 | 4/2014 | Chen et al. |
| 8,703,565 B2 | 4/2014 | Chang et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,735,993 B2 | 5/2014 | Lo et al. |
| 8,736,056 B2 | 5/2014 | Lee et al. |
| 8,742,509 B2 | 6/2014 | Lee et al. |
| 8,772,109 B2 | 7/2014 | Colinge |
| 8,776,734 B1 | 7/2014 | Roy et al. |
| 8,785,285 B2 | 7/2014 | Tsai et al. |
| 8,796,666 B1 | 8/2014 | Huang et al. |
| 8,796,759 B2 | 8/2014 | Perng et al. |
| 8,809,139 B2 | 8/2014 | Huang et al. |
| 8,815,712 B2 | 8/2014 | Wan et al. |
| 8,816,444 B2 | 8/2014 | Wann et al. |
| 8,823,065 B2 | 9/2014 | Wang et al. |
| 8,826,213 B1 | 9/2014 | Ho et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,860,148 B2 | 10/2014 | Hu et al. |
| 8,887,106 B2 | 11/2014 | Ho et al. |
| 9,105,490 B2 | 8/2015 | Wang et al. |
| 9,385,189 B1* | 7/2016 | Sung ............... H01L 21/823821 |
| 2011/0068407 A1 | 3/2011 | Yeh et al. |
| 2012/0299113 A1 | 11/2012 | Endo et al. |
| 2013/0011983 A1 | 1/2013 | Tsai et al. |
| 2013/0285153 A1 | 10/2013 | Lee et al. |
| 2014/0001574 A1 | 1/2014 | Chen et al. |
| 2014/0110755 A1 | 4/2014 | Colinge |
| 2014/0151812 A1 | 6/2014 | Liaw |
| 2014/0183600 A1 | 7/2014 | Huang et al. |
| 2014/0252412 A1 | 9/2014 | Tsai et al. |
| 2014/0264590 A1 | 9/2014 | Yu et al. |
| 2014/0264592 A1 | 9/2014 | Oxland et al. |
| 2014/0282326 A1 | 9/2014 | Chen et al. |
| 2014/0367795 A1 | 12/2014 | Cai et al. |
| 2015/0255609 A1 | 9/2015 | Zhu et al. |
| 2015/0263003 A1 | 9/2015 | Lee et al. |
| 2016/0056156 A1 | 2/2016 | Ghani et al. |
| 2016/0247876 A1 | 8/2016 | Chung et al. |
| 2016/0268260 A1* | 9/2016 | Lim ..................... H01L 27/0924 |
| 2016/0379981 A1 | 12/2016 | Balakrishnan et al. |
| 2017/0053835 A1 | 2/2017 | Sung et al. |
| 2017/0062429 A1 | 3/2017 | Sung et al. |
| 2017/0069630 A1 | 3/2017 | Cha et al. |
| 2017/0200810 A1* | 7/2017 | Mao ..................... H01L 29/785 |
| 2018/0047613 A1* | 2/2018 | Zhou ..................... H01L 21/7624 |

OTHER PUBLICATIONS

Chen, Kevin, et al., "Air Stable n-doping of WSe$_2$ by Silicon Nitride Thin Films with Tunable Fixed Charge Density", APL Materials, vol. 2, No. 092504, (2014), 7 pgs.

Hezel, R., "Very High Charge Densities in Silicon Nitride Films on Silicon for Inversion Layer Solar Cells", Institut für Werkstoffwissenschaften VI, Universität Erlangen-Nurnberg, D-8520 Erlangen, Fed. Rep. of Germany, pp. 219-223.

\* cited by examiner

FINFET DEVICE WITH DIFFERENT LINERS FOR PFET AND NFET AND METHOD OF FABRICATING THEREOF

PRIORITY DATA

This application is a divisional of U.S. application Ser. No. 15/725,544, filed Oct. 5, 2017 which claims benefit of U.S. Provisional Application No. 62/490,839, filed Apr. 27, 2017, both of which are herein incorporated by reference in their entirety.

BACKGROUND

The semiconductor industry has progressed into nanometer technology process nodes in pursuit of higher device density, higher performance, and lower costs. As this progression takes place, challenges from both fabrication and design issues have resulted in the development of three-dimensional designs, such as fin-like field effect transistor (FinFET) device. A typical FinFET device is fabricated with a thin "fin" (or fin-like structure) extending from a substrate. The fin usually includes silicon and forms the body of the transistor device. The channel of the transistor is formed in this vertical fin. A gate is provided over (e.g., wrapping around) the fin. This type of gate allows greater control of the channel. Other advantages of FinFET devices include reduced short channel effect and higher current flow.

However, conventional FinFET devices may still have certain drawbacks. For example, the shallow trench isolation (STI) liner for conventional FinFET devices have not been configured to optimize the performance of the FinFET devices.

Therefore, while existing FinFET devices and the fabrication thereof have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
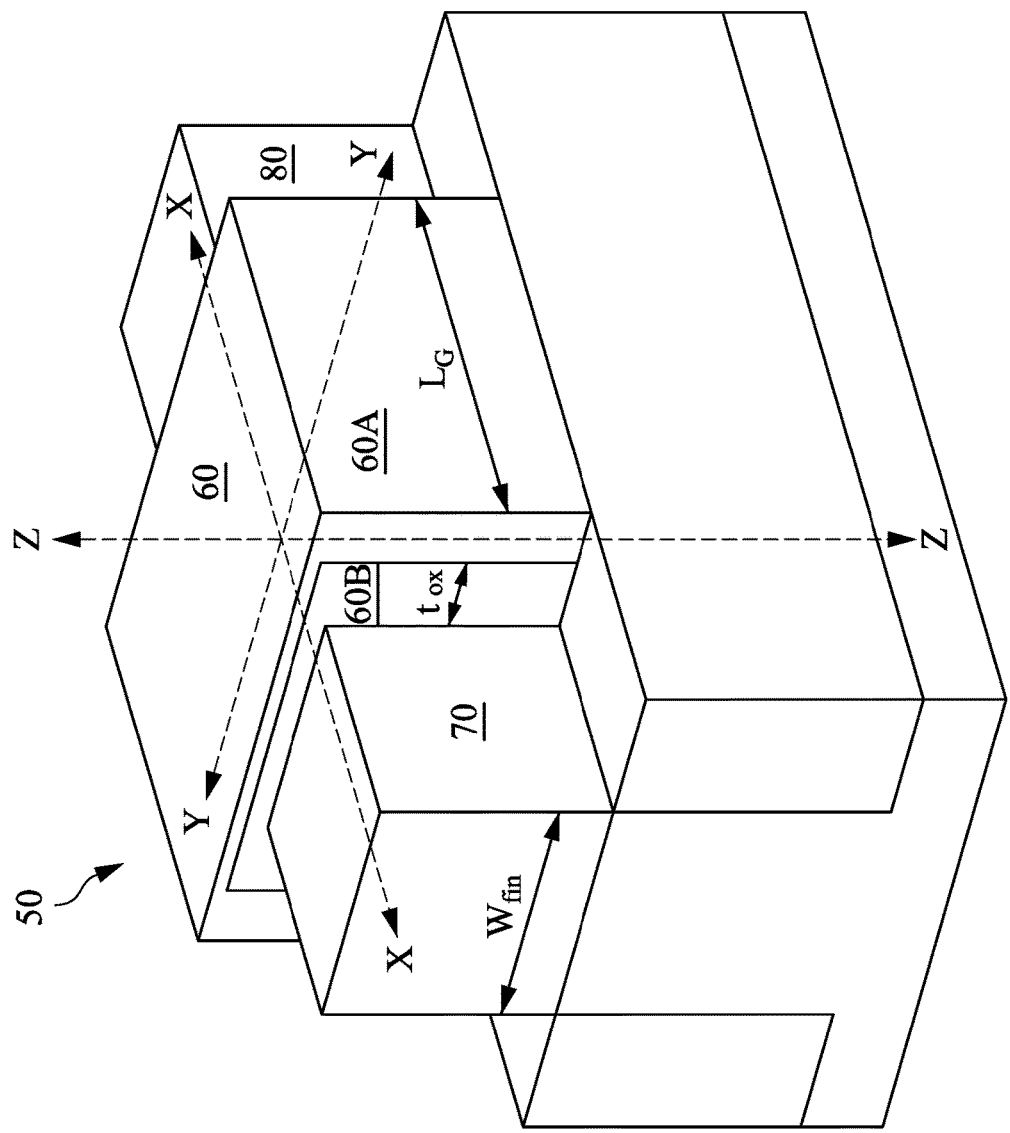
FIG. 1 is a perspective view of an example FinFET device.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor FinFET device and an N-type metal-oxide-semiconductor FinFET device. The following disclosure will continue with one or more FinFET examples to illustrate various embodiments of the present disclosure. It is understood, however, that the application should not be limited to a particular type of device, except as specifically claimed.

The use of FinFET devices has been gaining popularity in the semiconductor industry. Referring to FIG. 1, a perspective view of an example FinFET device 50 is illustrated. The FinFET device 50 is a non-planar multi-gate transistor that is built over a substrate (such as a bulk substrate). A thin silicon-containing "fin-like" structure (hereinafter referred to as a "fin") forms the body of the FinFET device 50. The fin extends along an X-direction shown in FIG. 1. The fin has a fin width $W_{fin}$ measured along a Y-direction that is orthogonal to the X-direction. A gate 60 of the FinFET device 50 wraps around this fin, for example around the top surface and the opposing sidewall surfaces of the fin. Thus, a portion of the gate 60 is located over the fin in a Z-direction that is orthogonal to both the X-direction and the Y-direction.

$L_G$ denotes a length (or width, depending on the perspective) of the gate 60 measured in the X-direction. The gate 60 may include a gate electrode component 60A and a gate dielectric component 60B. The gate dielectric 60B has a thickness $t_{ox}$ measured in the Y-direction. A portion of the gate 60 is located over a dielectric isolation structure such as shallow trench isolation (STI). A source 70 and a drain 80 of the FinFET device 50 are formed in extensions of the fin on opposite sides of the gate 60. A portion of the fin being wrapped around by the gate 60 serves as a channel of the FinFET device 50. The effective channel length of the FinFET device 50 is determined by the dimensions of the fin.

FinFET devices offer several advantages over traditional Metal-Oxide Semiconductor Field Effect Transistor (MOSFET) devices (also referred to as planar transistor devices).

These advantages may include better chip area efficiency, improved carrier mobility, and fabrication processing that is compatible with the fabrication processing of planar devices. FinFET devices are also compatible with a high-k metal gate (HKMG) process flow. Thus, FinFET devices may be implemented as HKMG devices where the gates each that have a high-k gate dielectric and a metal gate electrode. For these benefits discussed above, it may be desirable to design an integrated circuit (IC) chip using FinFET devices for a portion of, or the entire IC chip.

However, traditional FinFET fabrication methods may still have shortcomings. For example, conventional FinFET fabrication may use the same type of shallow trench isolation (STI) liner material for both NFETs and PFETs. This approach does not optimize the performance of FinFET transistors. To improve the performance for FinFET devices, the present disclosure utilizes a dual STI liner approach to simultaneously improve the performance for both NFETs and PFETs, as discussed in more detail below with reference to FIGS. 2-18.

Figure 2:
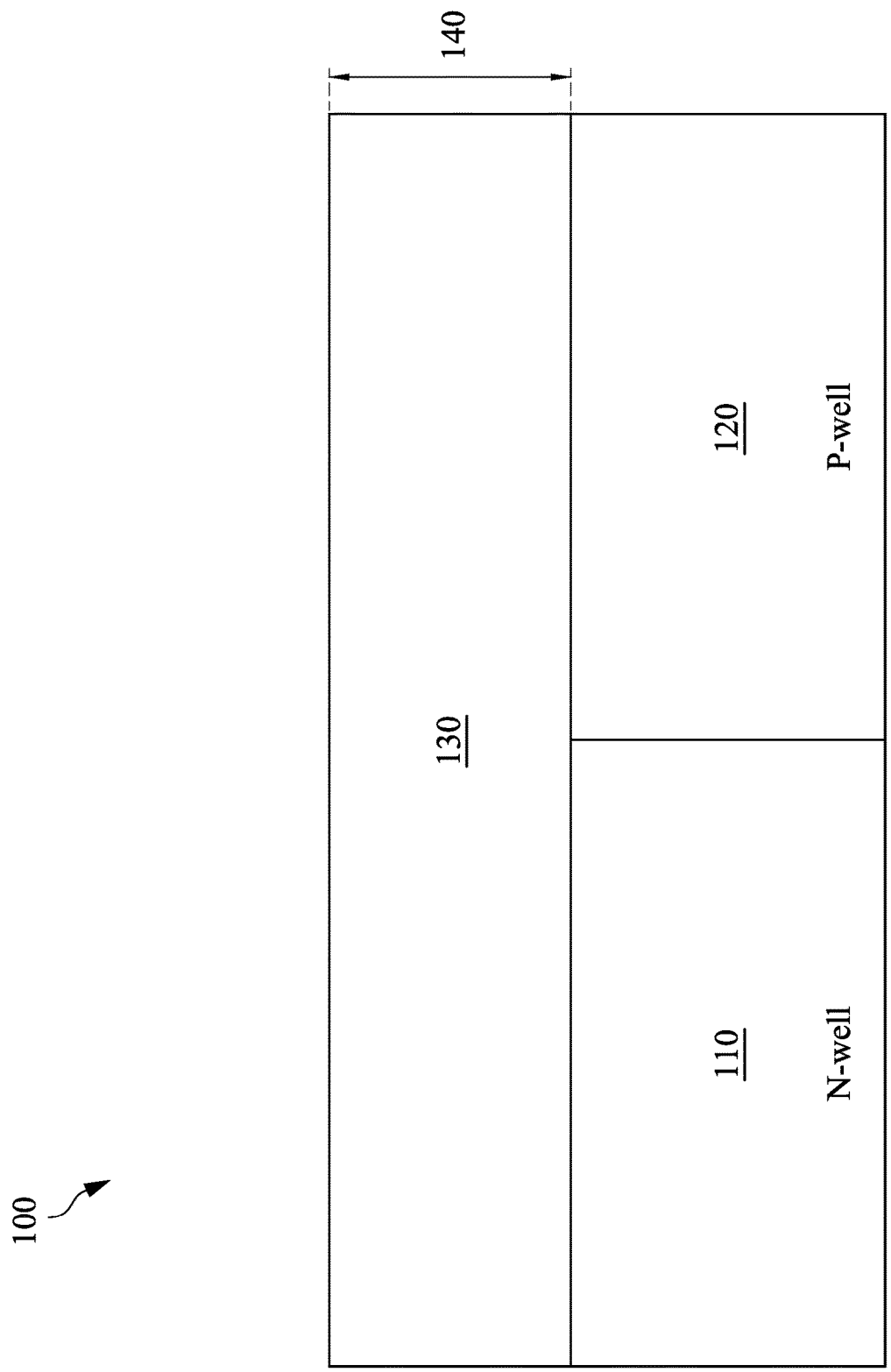
FIGS. 2-17 are cross-sectional side views of a FinFET device at different stages of fabrication according to various embodiments of the present disclosure.

FIGS. 2-17 are diagrammatic fragmentary cross-sectional side views of a FinFET device 100 at various stages of fabrication. Referring to FIG. 2, the FinFET device 100 includes an N-well 110 and a P-well 120 each formed in a substrate. The substrate may be a semiconductor substrate, for example a silicon substrate. The N-well 110 and the P-well 120 may be formed using one or more ion implantation processes and are doped differently, so as to have different types of conductivity. The dopant ions may include an n-type material in some embodiments, for example arsenic (As) or phosphorous (P), or they may include a p-type material in some other embodiments, for example boron (B), depending on whether an NFET or a PFET is needed.

A semiconductor layer 130 is formed over the N-well 110 and over the P-well 120. In some embodiments, the semiconductor layer 130 includes silicon. The silicon material of the semiconductor layer 130 may be grown over the N-well 110 and the P-well 120 using an epitaxial growth process. The semiconductor layer 130 is grown to have a thickness 140. In some embodiments, the thickness 140 is in a range between about 30 nanometers (nm) and about 70 nm. A portion of the semiconductor layer 130 (after undergoing a patterning process) will serve as the fin for the NFET (also referred to as an NMOS) of the FinFET device 100, as will be discussed in more detail below.

Figure 3:
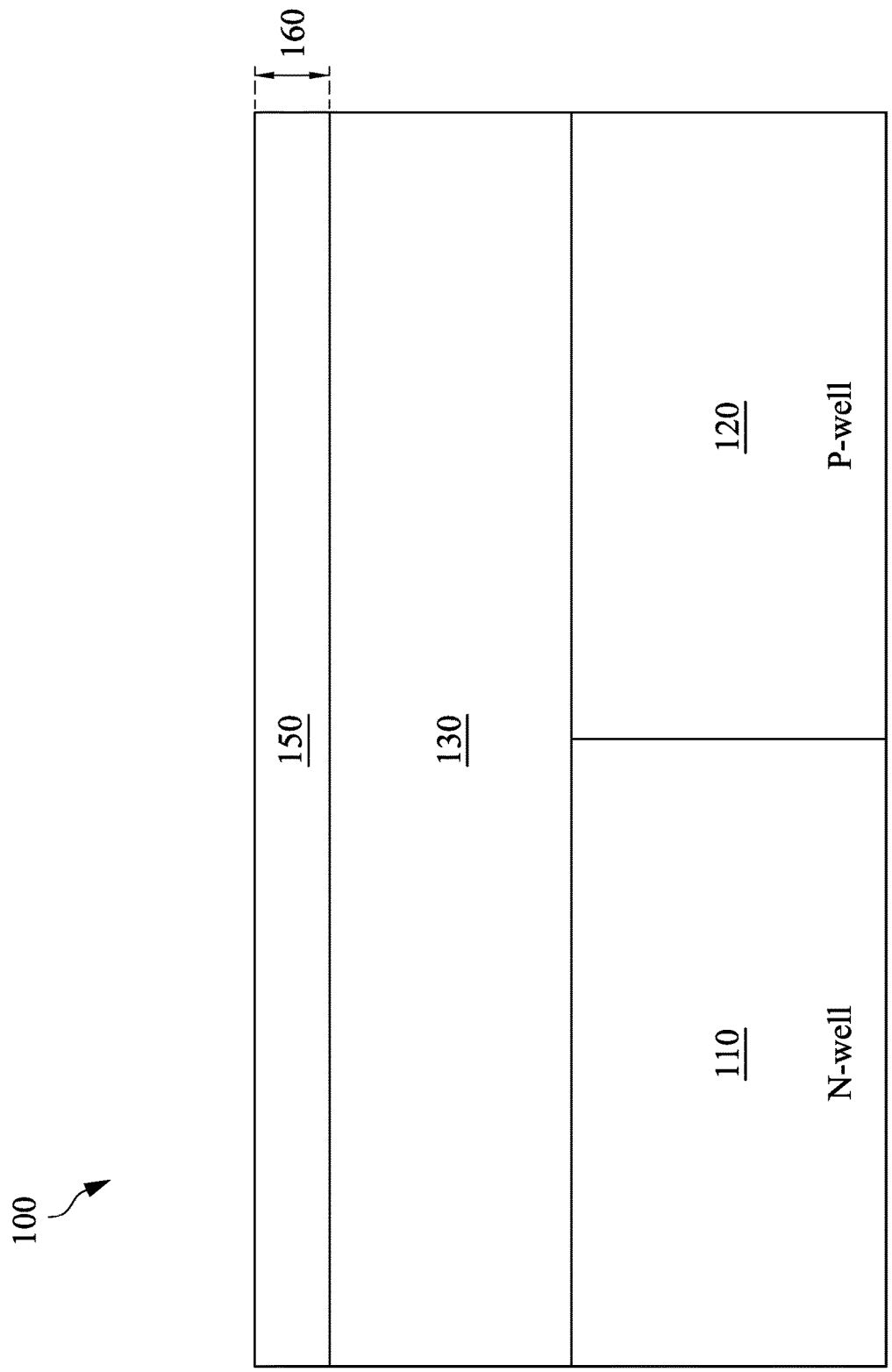

Referring now to FIG. 3, a dielectric layer 150 is formed over the semiconductor layer 130. In some embodiments, the dielectric layer 150 includes an oxide material, for example silicon oxide. The dielectric layer 150 may be formed using a deposition process such as chemical vapor deposition (CVD), physical vapor deposition (PVD), atomic layer deposition (ALD), or combinations thereof. The dielectric layer 150 is formed to have a thickness 160. In some embodiments, the thickness 160 is in a range between about 10 nm and about 20 nm. The dielectric layer 150 will serve as a hard mask in a patterning process discussed below.

Figure 4:
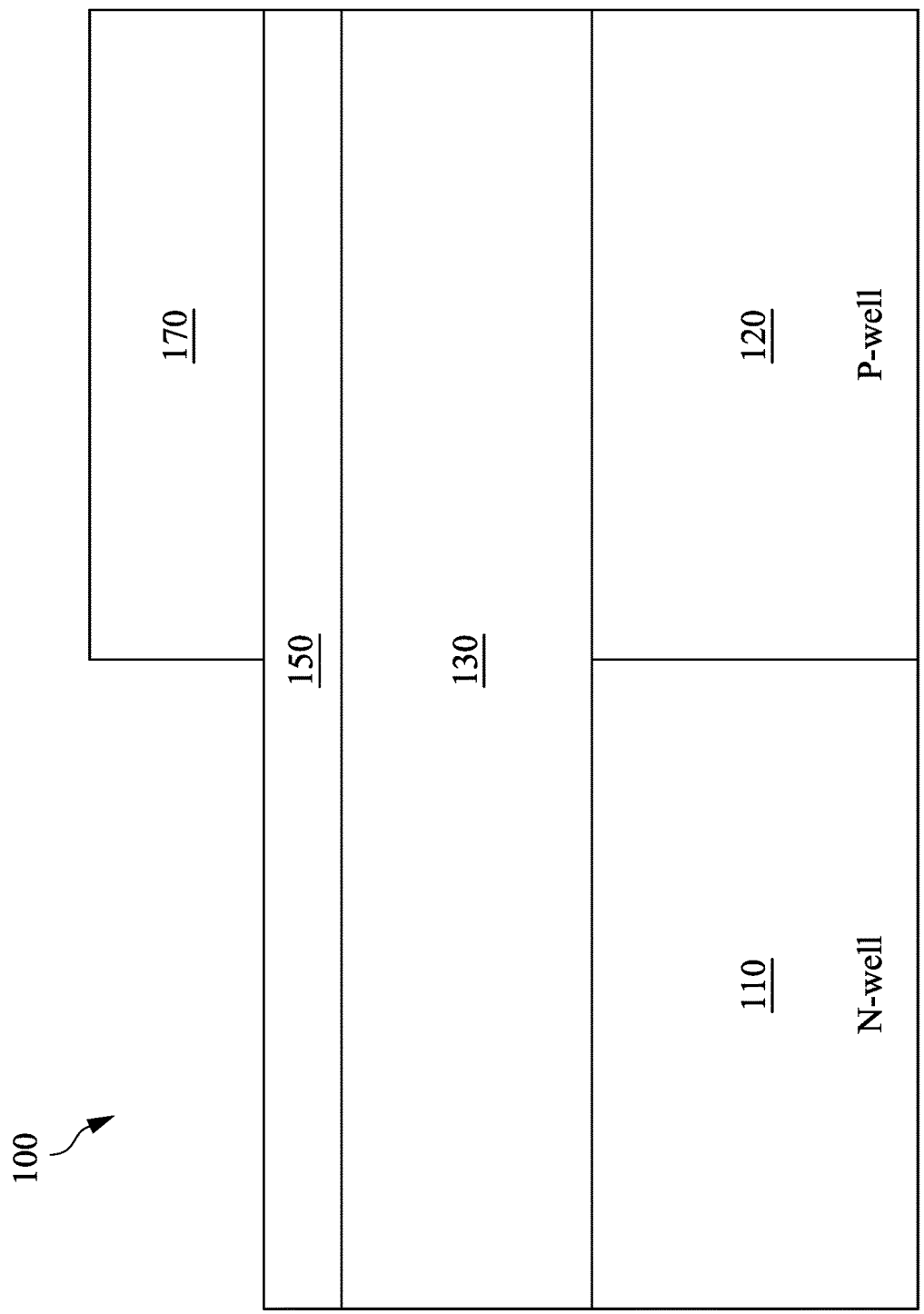

Referring now to FIG. 4, a patterned photoresist layer 170 is formed over the dielectric layer 150. In some embodiments, the patterned photoresist layer 170 is formed by one or more processes such as photoresist coating (e.g., photoresist spin-coating), exposing, post-exposure baking, developing, and rinsing. After being developed, the patterned photoresist layer 170 is formed by the remaining portions of the photoresist material. As is shown in FIG. 4, the patterned photoresist layer 170 is formed over the P-well 120 but not over the N-well 110. In other words, the patterned photoresist layer 170 is aligned vertically (e.g., in the Z-direction shown in FIG. 1) with the P-well 120, but not with the N-well 110.

Figure 5:
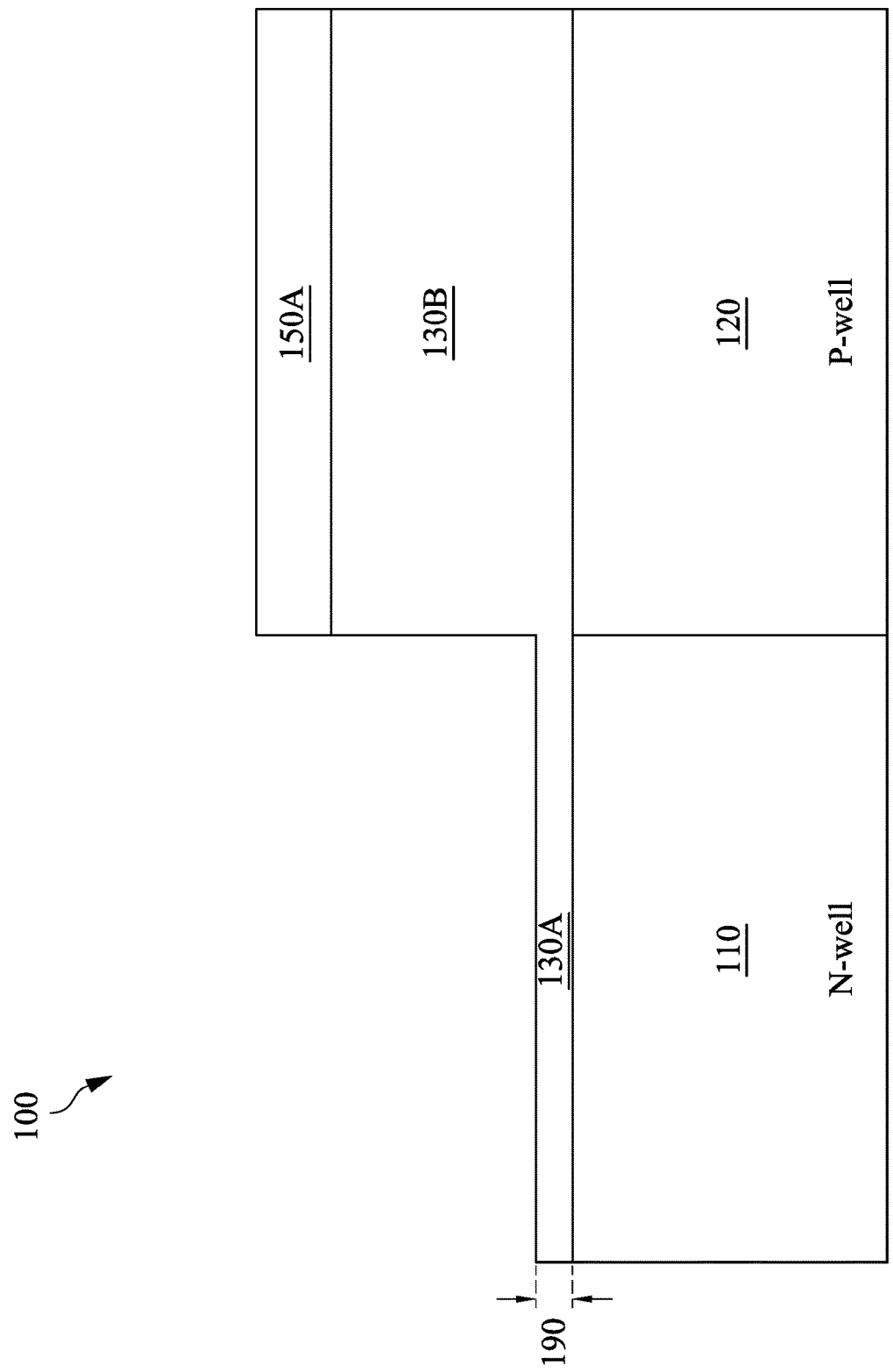

Referring now to FIG. 5, the dielectric layer 150 is patterned by the patterned photoresist layer 170, thereby forming a patterned hard mask 150A. The patterned photoresist layer 170 is then removed, for example using a photoresist stripping process or a photoresist ashing process. Using the patterned hard mask 150A as a protective mask, an etching process is then performed to etch away portions of the semiconductor layer 130. In other words, the patterned hard mask 150A protects a portion 130B of the semiconductor layer 130 therebelow from being etched during the etching process, while portions of the semiconductor layer 130 not protected by the patterned hard mask 150A are removed.

As is shown in FIG. 5, the etching process is performed in a manner such that a portion 130A of the semiconductor layer 130 still remains over the N-well 110. The portion 130A and the rest of the semiconductor layer 130 have the same material compositions (e.g., they both contain Si), since the portion 130A is a part of the layer 130. The portion 130A of the semiconductor layer 130 is formed to have a thickness 190. In some embodiments, the thickness 190 is in a range between about 2 nm and about 8 nm. One of the reasons for preserving the portion 130A of the semiconductor layer 130 is for better epi-growth of a silicon germanium material in a later process. For example, the portion 130A of the semiconductor layer 130 helps isolate the N-well 110 from the silicon germanium material to be grown over the semiconductor layer 130 later.

Figure 6:
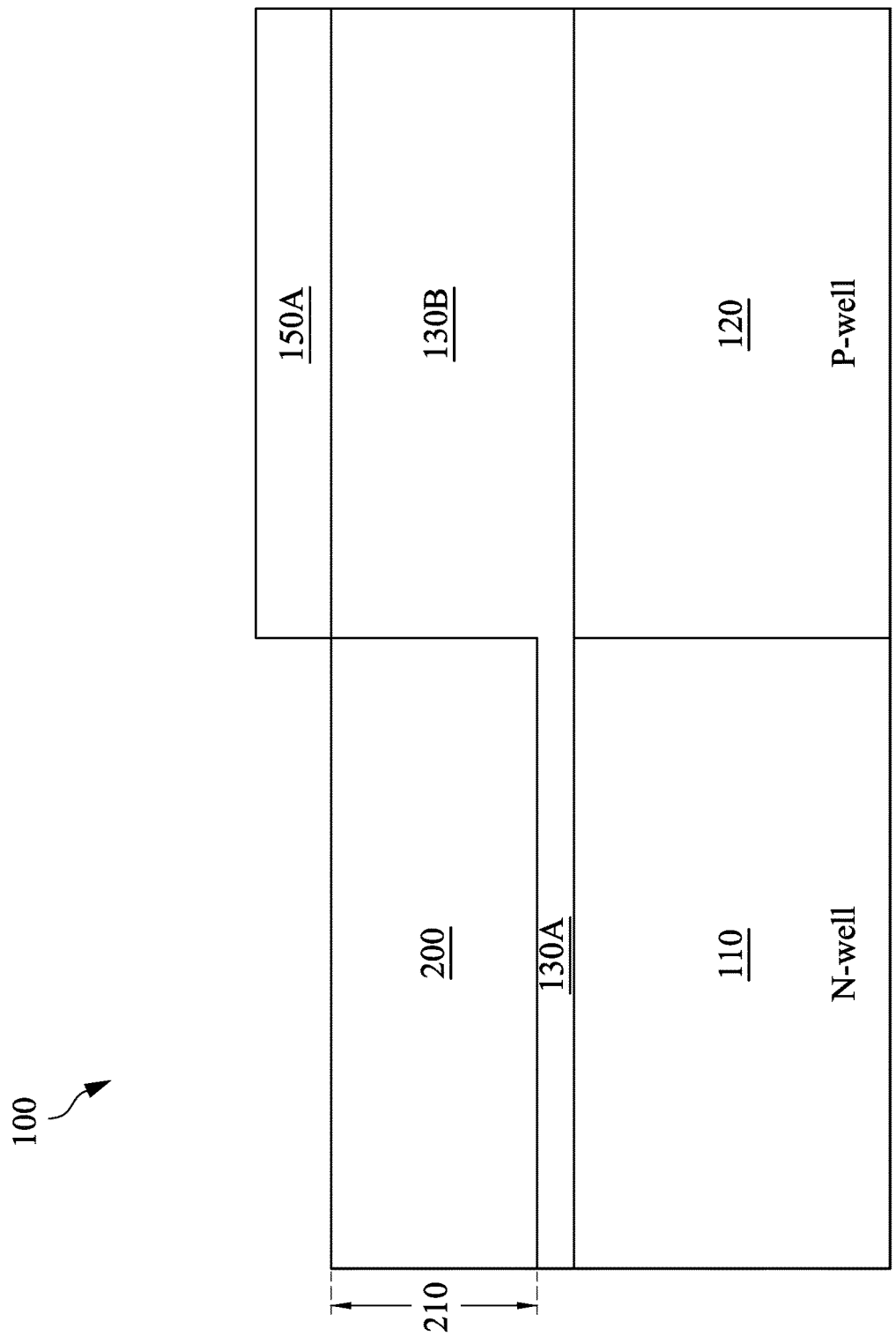

Referring now to FIG. 6, a semiconductor layer 200 is formed over the portion 130A of the semiconductor layer 130. The semiconductor layer 200 has a different material composition than the semiconductor layer 130. For example, in some embodiments, the semiconductor layer 200 includes silicon germanium (SiGe). The semiconductor layer 200 may be grown using an epitaxial growth process. As discussed above, due to the presence of the portion 130A of the semiconductor layer 130, the semiconductor layer 200 is not formed directly on the N-well 110 but on the portion 130A of the semiconductor layer 130. The portion 130A of the semiconductor layer 130 provides isolation between the N-well 110 and the semiconductor layer 200 and allows the semiconductor layer 200 to be formed with better epitaxial growth quality. The semiconductor layer 200 is formed to have a thickness 210. In some embodiments, the thickness 210 is in a range from about 40 nm and about 60 nm. The semiconductor layer 200 will serve as the fin for a PFET (also referred to as a PMOS) of the FinFET device 100, as will be discussed in more detail below.

Figure 7:
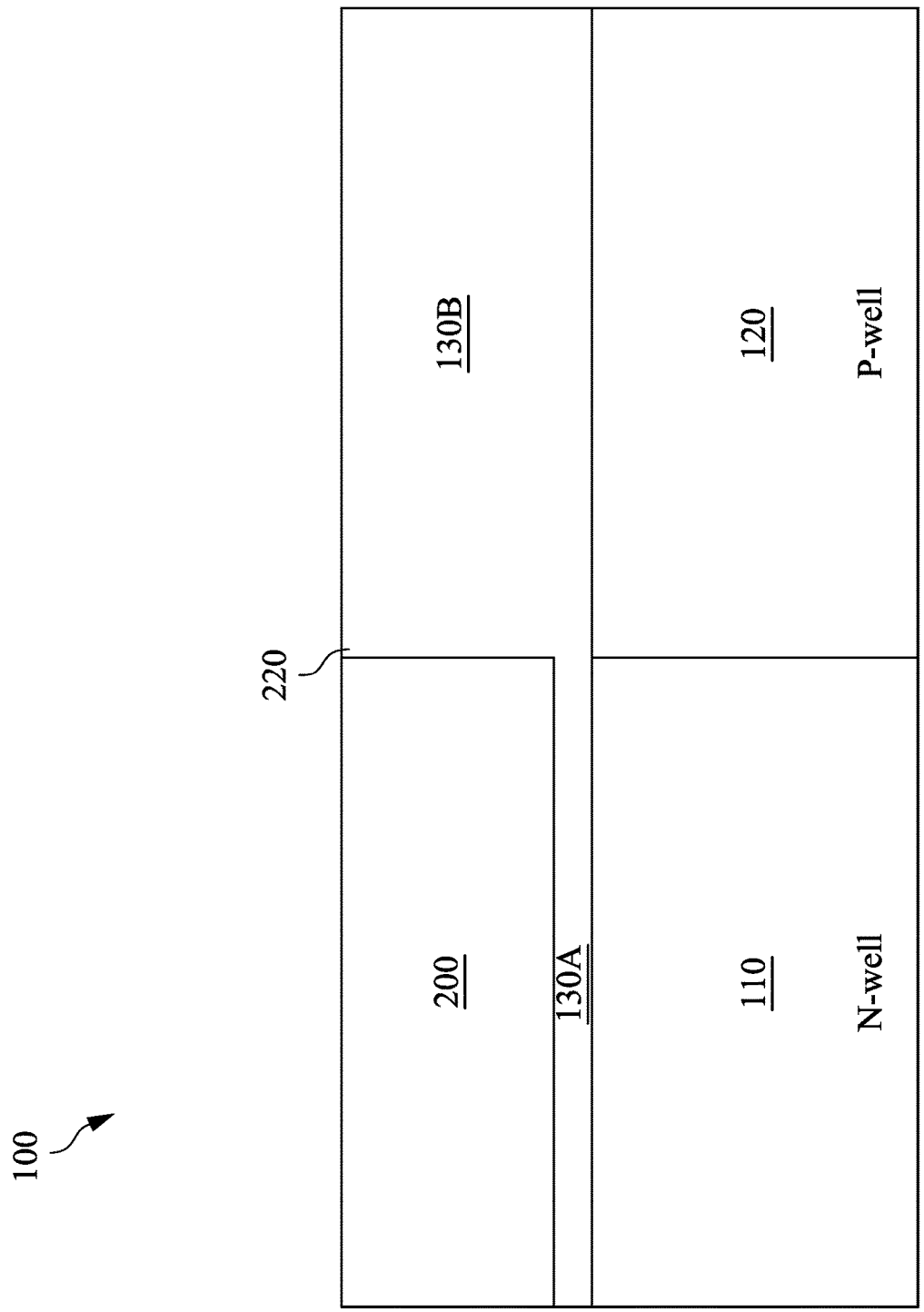

Referring now to FIG. 7, the patterned hard mask 150A is removed, for example using a polishing process such as chemical-mechanical-polishing (CMP). The CMP process may also remove a small portion of the semiconductor layer 200 and the portion 130B of the semiconductor layer 130. As a result of the polishing process, the FinFET device 100 now has a substantially flat or planarized upper surface 220.

Figure 8:
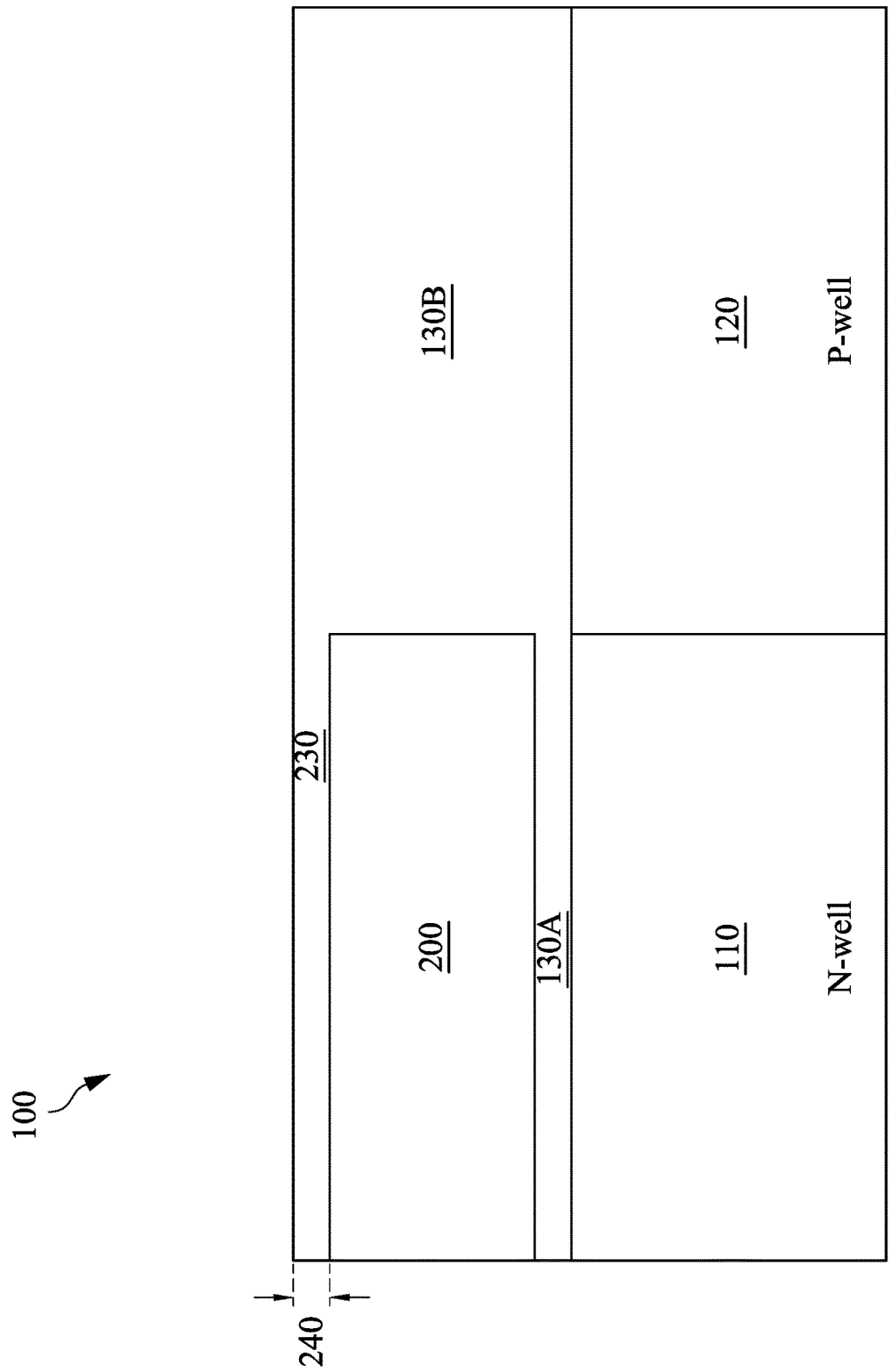

Referring now to FIG. 8, a capping layer 230 is formed on the planarized upper surface 220 of the semiconductor layers 200 and 130B. In some embodiments, the capping layer 230 includes silicon and may be referred to as a silicon capping layer. The capping layer 230 is formed to have a thickness 240. In some embodiments, the thickness 240 is in a range from about 0.5 nm and about 5 nm. The capping layer 230 protects the semiconductor layer 200 from undesirable oxidation. For example, if exposed to ambient air (which contains oxygen), the silicon germanium material in the semiconductor layer 200 is easy to become oxidized, which is undesirable as it may adversely affect the intended function of the silicon germanium material (e.g., to serve as a semi-conductive material). The formation of the capping layer 230 prevents the semiconductor layer 200 from air exposure, and as such it prevents the potential oxidation of the silicon germanium material of the semiconductor layer 200. The capping layer 230 will be removed in a later process.

Figure 9:
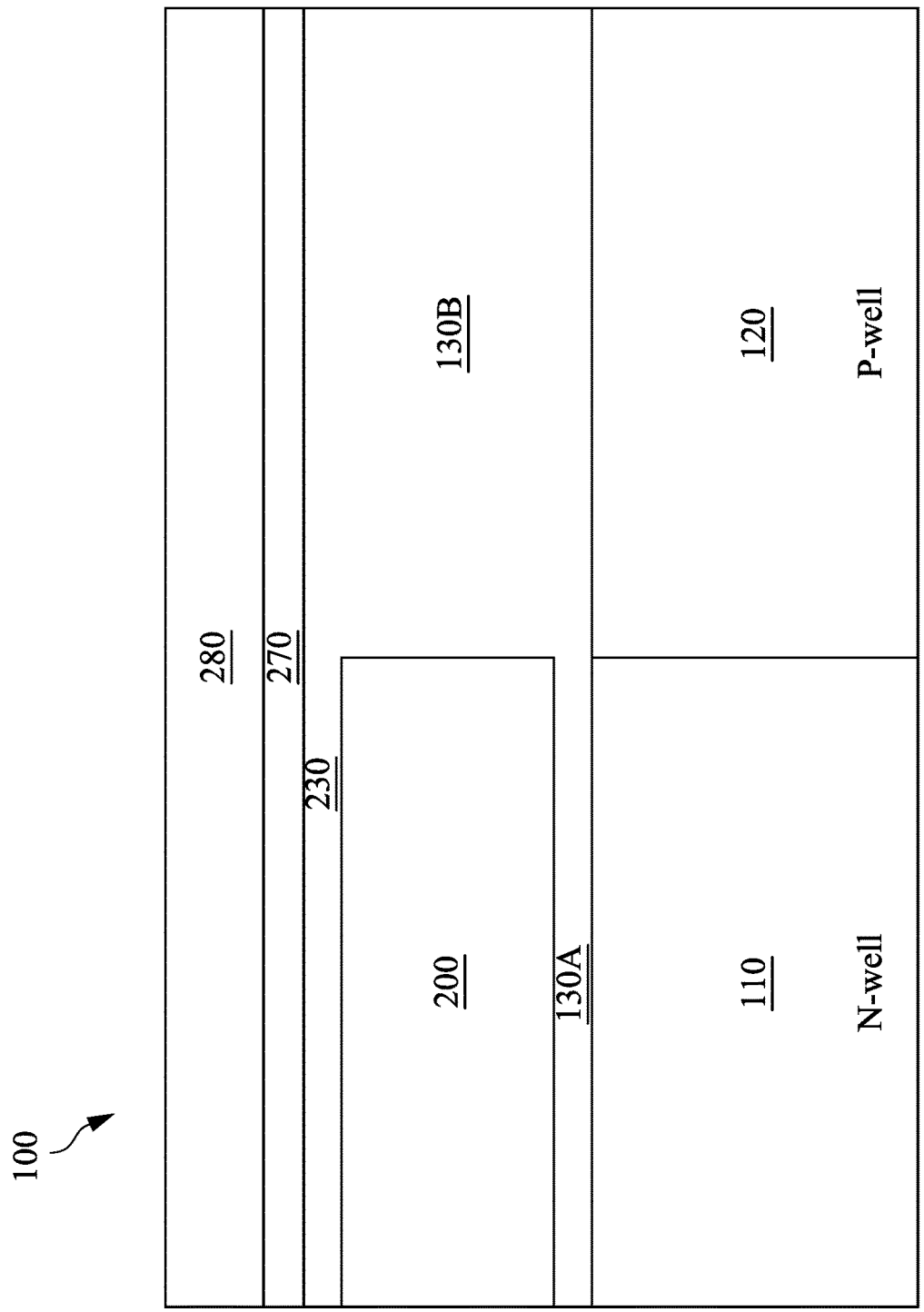

Referring now to FIG. 9, a dielectric layer 270 is formed over the capping layer 230. In some embodiments, the dielectric layer 270 includes silicon oxide and may be referred to as a pad oxide layer 270. A dielectric layer 280 is then formed over the dielectric layer 280 is formed over the dielectric layer 270. In some embodiments, the dielectric layer 280 includes silicon nitride and may be referred to as a pad nitride layer 280. The dielectric layers 270 and 280 may serve as materials for a hard mask for a subsequent photolithography patterning process.

Figure 10:
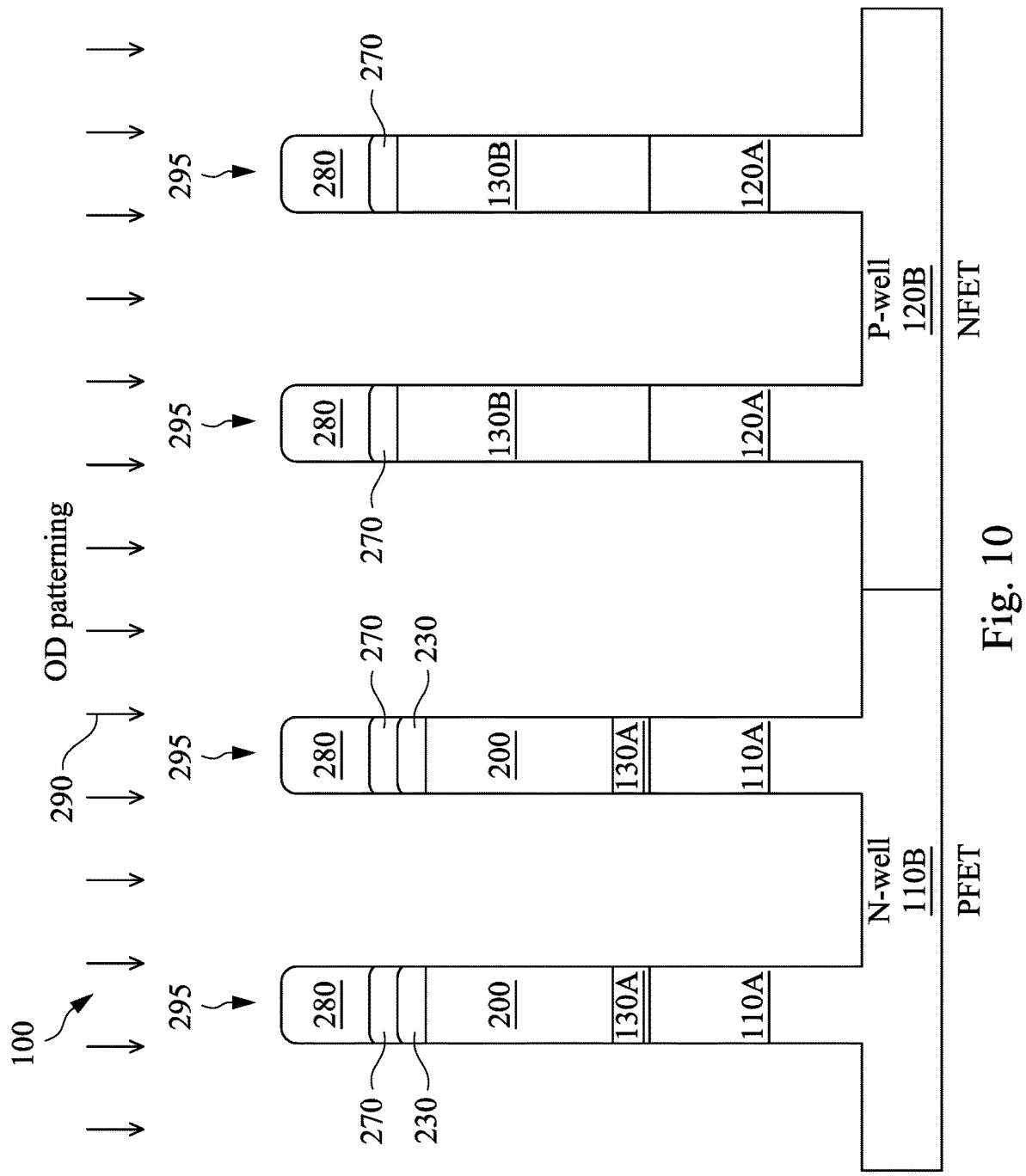

Referring now to FIG. 10, an OD (active region) patterning process 290 is performed to form upwardly-protruding (e.g., upwardly in the Z-direction of FIG. 1) fin structures 295. As a part of the OD patterning process 290, the dielectric layers 270 and 280 may be patterned (e.g., using a patterned photoresist layer) to form patterned hard masks that define the lateral dimensions of the fin structures 295. The patterned hard masks 270/280 are then used to pattern the layers therebelow. For example, portions of the layers 230, 200 and 130B and the N-well 110 and P-well 120 not protected by the patterned masks 270/280 are etched away in one or more etching processes. It can be seen that the N-well 110 is etched so that a segment 110A thereof protrudes out of a segment 110B that is not etched away, and the P-well 120 is etched so that a segment 120A thereof protrudes out of a segment 120B that is not etched away. It is understood that the segment 110A and the segment 110B have the same material compositions, and that the segment 120A and the segment 120B have the same material compositions. However, the doping concentration levels may be different between the segments 110A and 110B, and between the segments 120A and 120B. For example, the segment 110B may have a lower doping concentration level than the segment 110A, and the segment 120B may have a lower doping concentration level than the segment 120A. The remaining portions of the layers 230 and 200, the portion 130A, and the upwardly-protruding segments of the N-well 110A collectively form the fin structures 295 for the PFET, and the remaining portions of the semiconductor layers 130B and the upwardly-protruding segments of the P-well 120A collectively form the fin structures 295 for the NFET. The channel and source/drain regions of the NFET and the PFET may be formed in the fin structures 295, for example in the semiconductor layers 200 and 130B.

Figure 11:
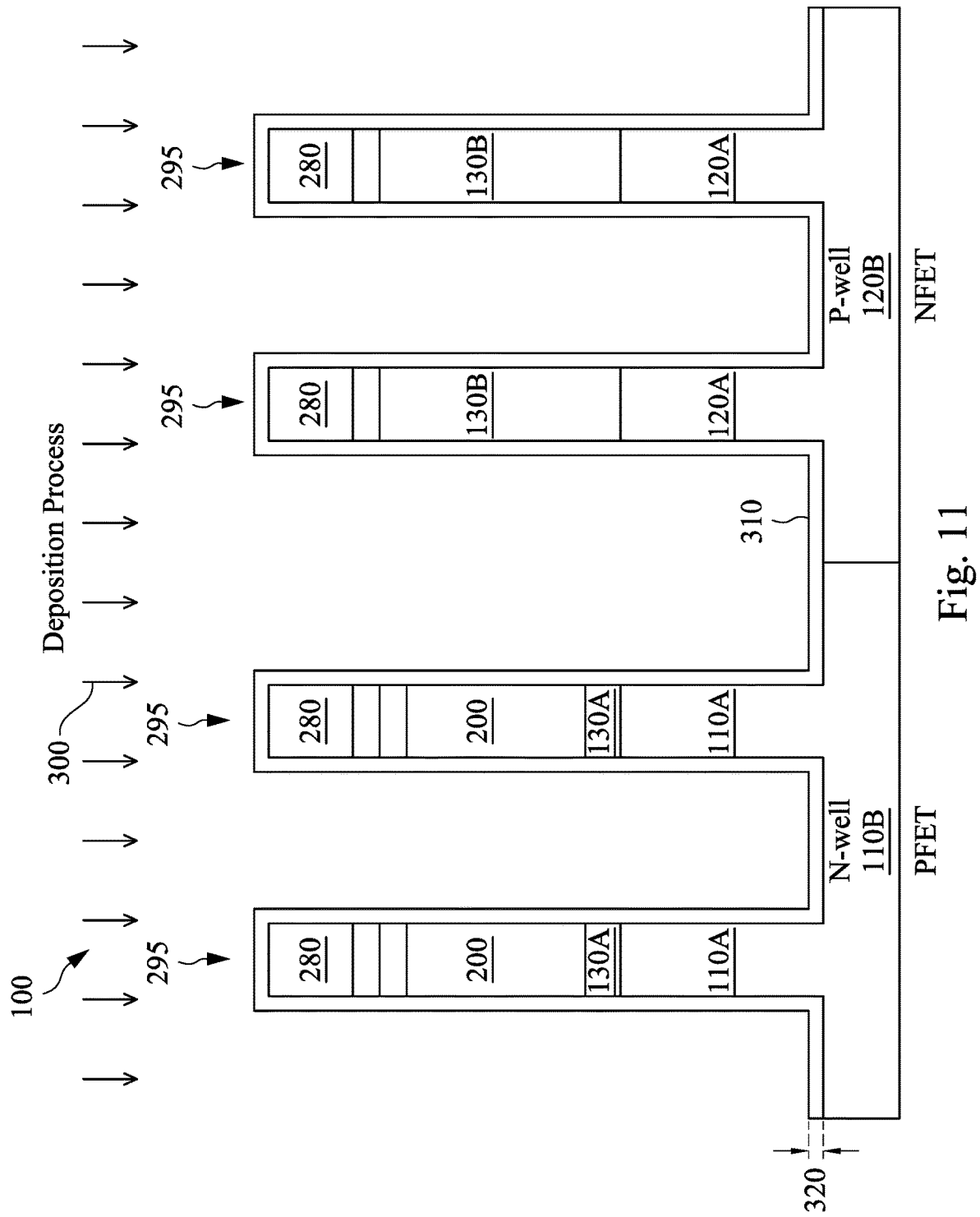

Referring now to FIG. 11, a deposition process 300 is performed to form a nitride-containing liner layer 310 on the top surfaces and side surfaces of each of the fin structures 295. In some embodiments, the deposition process 300 includes a CVD process with a deposition process temperature range between about 550 degrees Celsius and about 950 degrees Celsius. For example, in the PFET, the nitride-containing liner layer 310 is formed on the sidewall surfaces of the semiconductor layer 200 and on the sidewall surfaces of the segment 110A of the N-well 110. In some embodiments, the nitride-containing liner layer 310 is in direct physical contact with the sidewall surfaces of the semiconductor layer 200 and with the sidewall surfaces of the segment 110A of the N-well 110. In some embodiments, the nitride-containing liner layer 310 may include a silicon nitride material. The nitride-containing liner layer 310 is formed to have a thickness 320. In some embodiments, the deposition process 300 is configured such that the thickness 320 is in a range from about 2 nm to about 5 nm.

The silicon-nitride material of the liner layer 310 prevents the silicon germanium material of the semiconductor layer 200 from being exposed to the oxygen in the air. As discussed above, silicon germanium is prone to undesirable oxidation. After the performance of the OD patterning process 290 discussed above with reference to FIG. 10, the sidewalls of the semiconductor layer 200 (containing silicon germanium) in the fin structures 295 are exposed. If no other measures are taken, the exposure of the semiconductor layer 200 to air would oxidize the silicon germanium in the semiconductor layer 200, thereby degrading device performance.

To suppress the oxidation of the semiconductor layer 200, the present disclosure forms the nitride-containing liner layer 310 (e.g., containing silicon nitride) on the sidewalls of the semiconductor layer 200 to prevent semiconductor layer 200 from being exposed to air. The presence of the nitride-containing liner layer 310 thus reduces the likelihood of undesirable oxidation of the semiconductor layer 200. The range of the thickness 320 is also configured to optimize the function of the nitride-containing liner layer 310, for example with respect to preventing the oxidation of the semiconductor layer 200. It is understood that although silicon nitride is used as an example of the nitride-containing liner layer 310, other suitable materials may also be used, as long as those materials are suitable to prevent the oxidation of the silicon germanium of the semiconductor layer 200.

Note that the nitride-containing liner layer 310 is also formed on the fin structures 295 for the NFET. However, this is not needed, and thus the nitride-containing liner layer 310 for the NFET may be removed in a later process.

Figure 12:
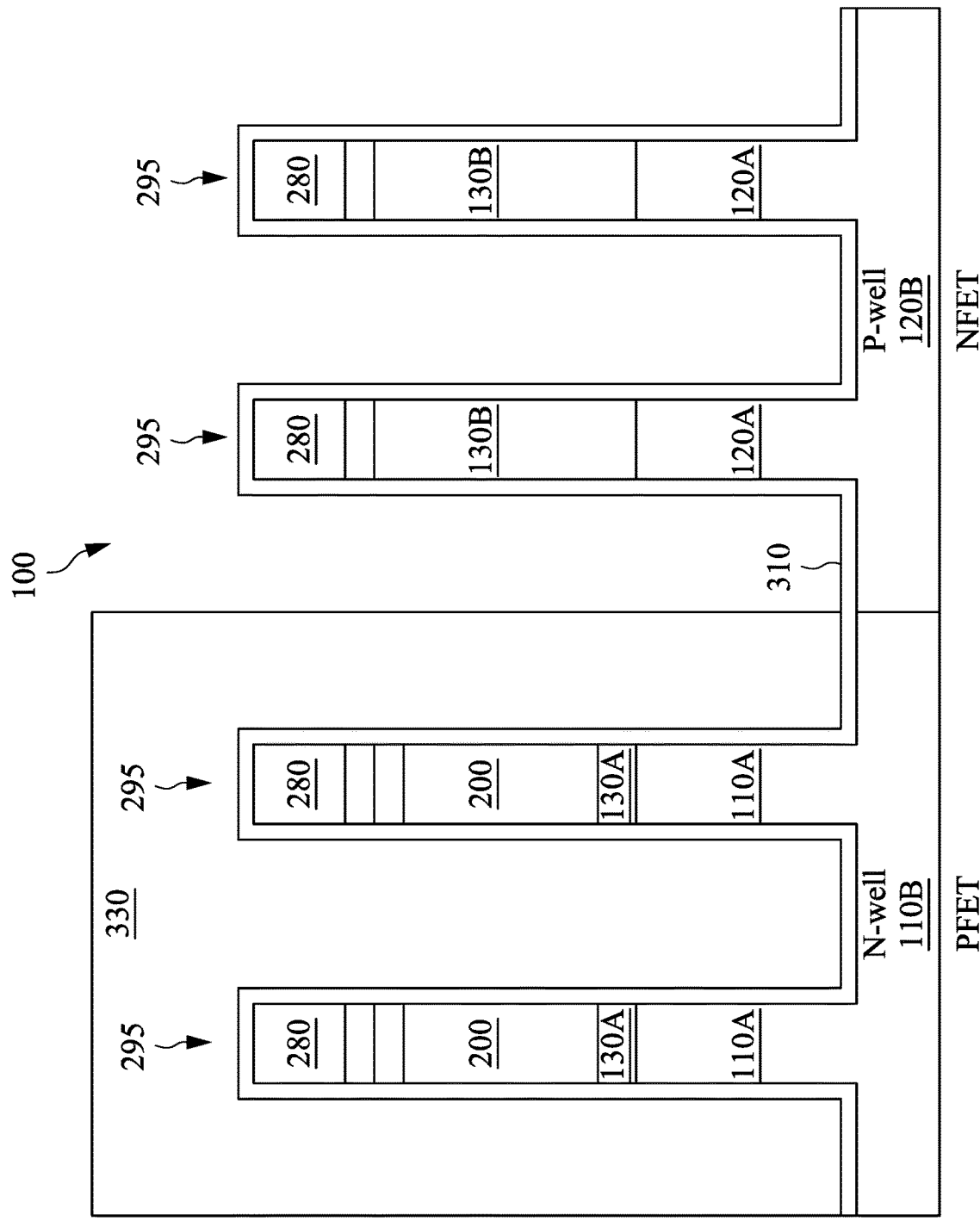

Referring now to FIG. 12, a patterned photoresist layer 330 is formed to cover up the PFET of FinFET device 100 while leaving the NFET exposed. In other words, the patterned photoresist layer 330 is formed over the fin structures 295 that are formed over the N-well 110B, but not over the fin structures 295 that are formed over the P-well 120B. As such, the segment of the nitride-containing liner layer 310 of the PFET is covered up by the patterned photoresist layer 330, while the segment of the nitride-containing liner layer 310 of the NFET is exposed. The patterned photoresist layer 330 may be formed by processes such as deposition, exposure, developing, baking, etc. (not necessarily performed in that order).

Figure 13:
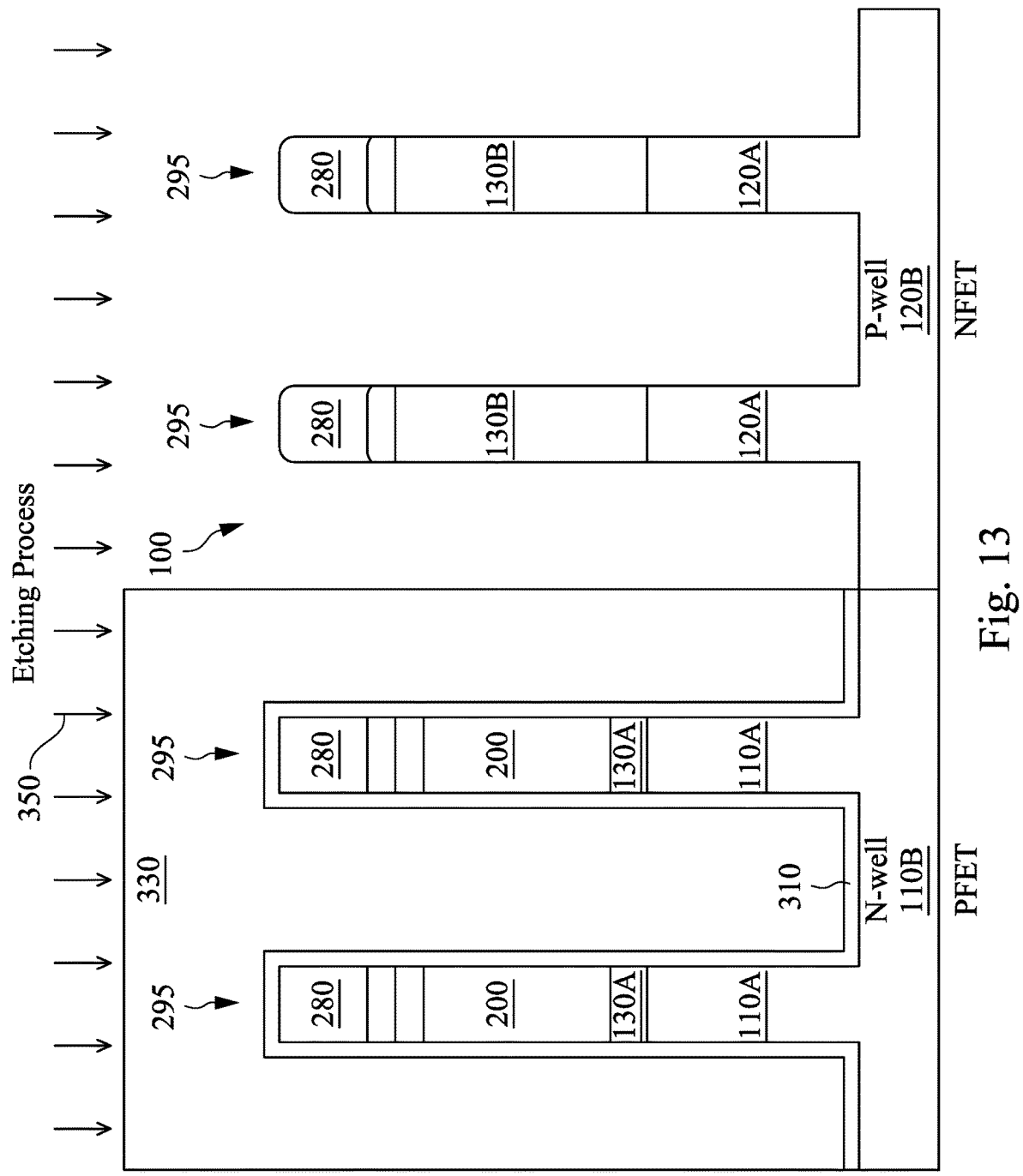

Referring now to FIG. 13, an etching process 350 is performed to the FinFET device 100 to remove the portion of the nitride-containing liner layer 310 that is disposed in the NFET region of the FinFET device 100. The patterned photoresist layer 330 protects the nitride-containing liner layer 310 therebelow from being etched during the etching process 350. As such, the portion of the nitride-containing liner layer 310 in the PFET remains intact and not removed by the etching process 350. However, since the portion of the nitride-containing liner layer 310 that is disposed in the NFET is not protected by the patterned photoresist 330, the nitride-containing liner layer 310 is removed for the NFET, thereby exposing the upper surfaces and the sidewall surfaces of the fin structures 295 of the NFET. For example, the sidewall surfaces of the semiconductor layer 130B are exposed, as are the sidewall surfaces of the segments 120A of the P-well.

Figure 14:
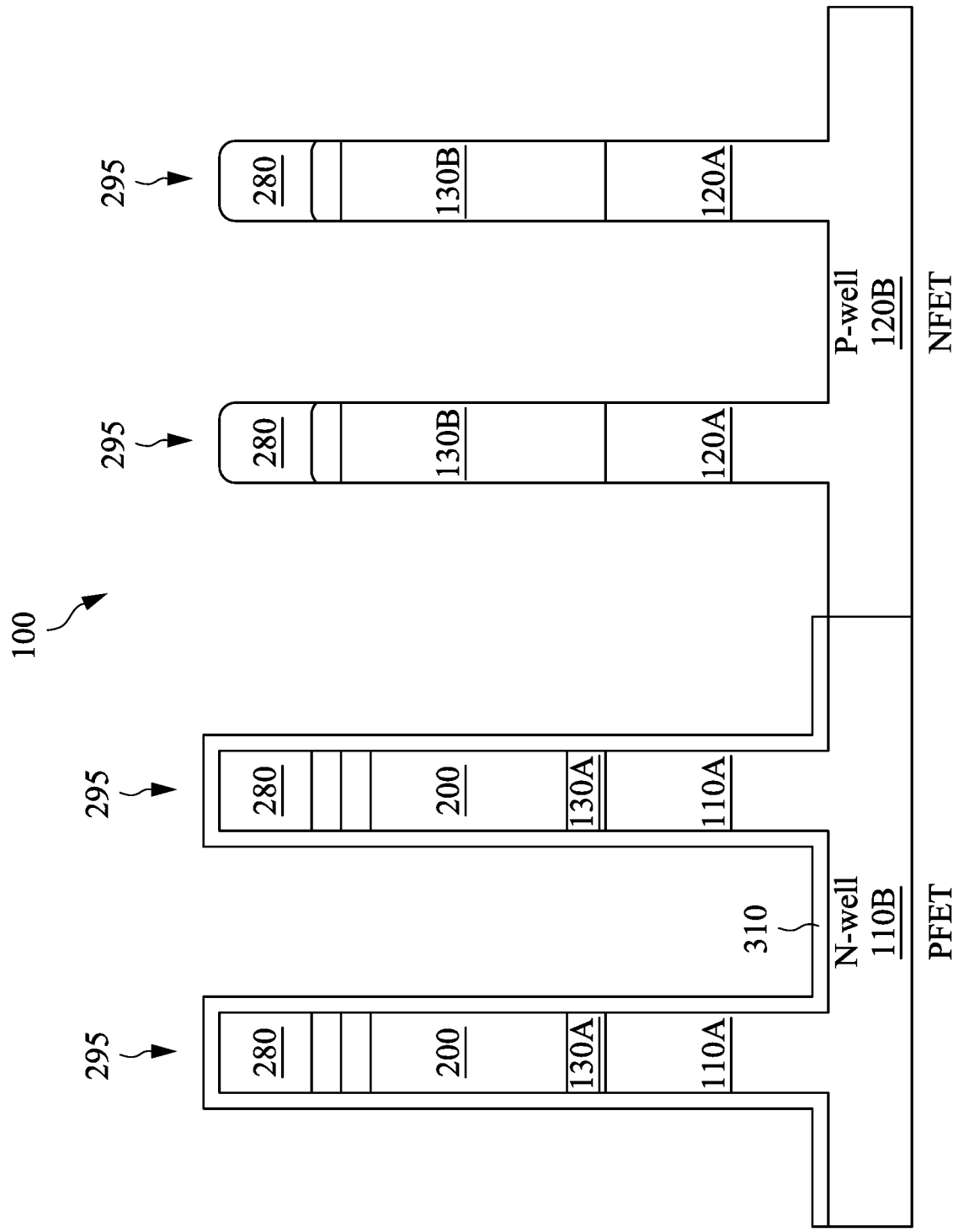

Referring now to FIG. 14, the patterned photoresist layer 330 is removed, for example using a photoresist stripping process or a photoresist ashing process. The removal of the patterned photoresist layer 330 leaves the nitride-containing liner layer 310 (cover the fin structures 295 in the PFET) exposed.

Figure 15:
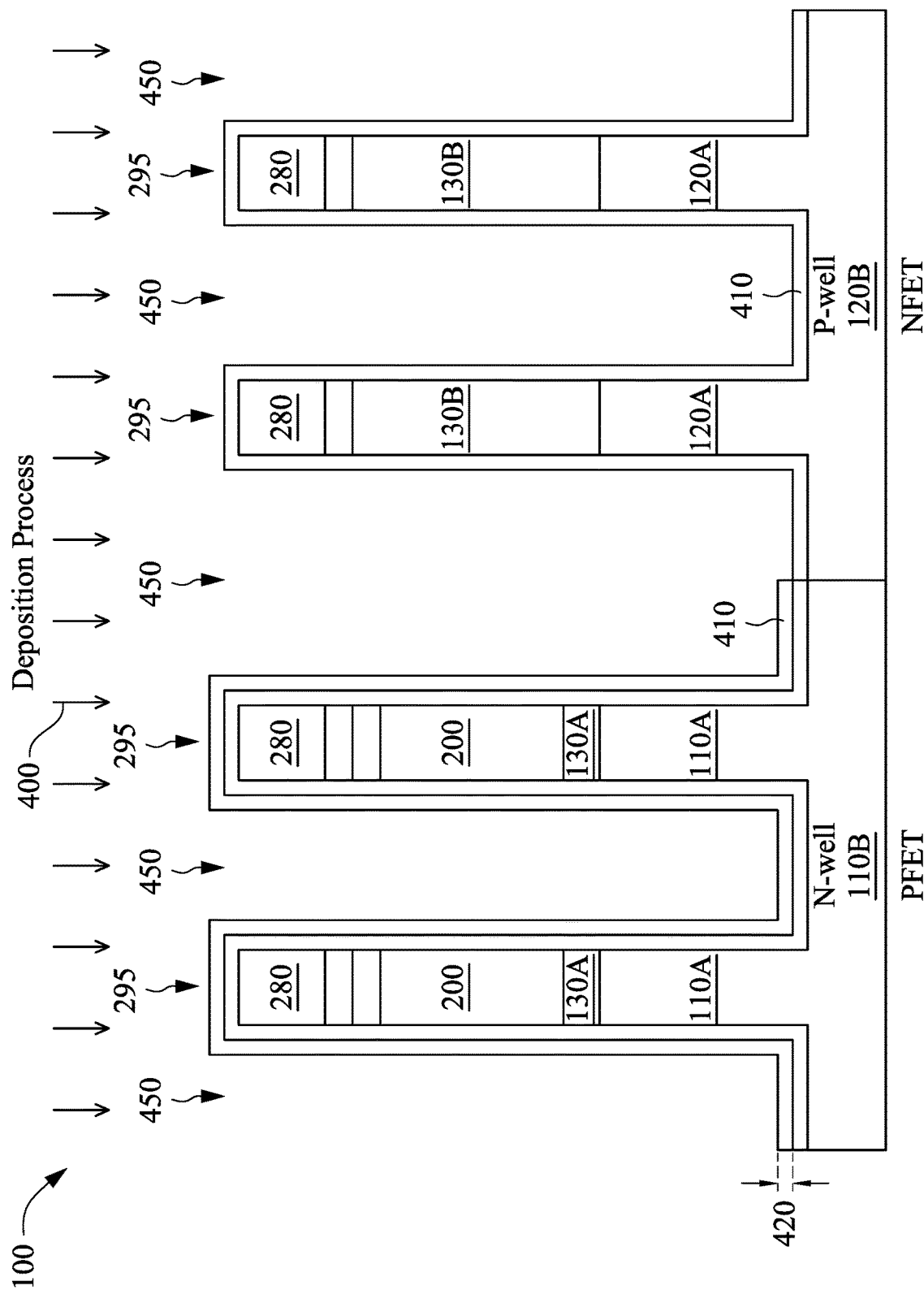

Referring now to FIG. 15, a deposition process 400 is performed to form an oxide-containing liner layer 410 on the top surfaces and side surfaces of each of the fin structures 295. In some embodiments, the deposition process 400 includes a CVD process with a deposition process temperature range between about 550 degrees Celsius and about 950 degrees Celsius. For example, in the PFET, the oxide-containing liner layer 410 is formed on the nitride-containing liner layer 310. In some embodiments, the oxide-containing liner layer 410 is in direct physical contact with the nitride-containing liner layer 310. In the NFET, the oxide-containing liner layer 410 is formed on the sidewall surfaces of the semiconductor layer 130B and on the sidewall surfaces of the segment 120A of the P-well 120. In some embodiments, the oxide-containing liner layer 410 is in direct physical contact with the sidewall surfaces of the semiconductor layer 130B and with the sidewall surfaces of the segment 120A of the P-well 120.

In some embodiments, the oxide-containing liner layer 410 may include a silicon oxide material. In some other embodiments, the oxide-containing liner layer 410 may include an aluminum oxide material. The oxide-containing liner layer 410 is formed to have a thickness 420. In some embodiments, the deposition process 300 is configured such that the thickness 420 is in a range from about 2 nm to about 5 nm.

The silicon oxide material of the liner layer 410 causes stress. For example, since the channel of the NFET will be formed in the semiconductor layer 130B, the proximity (e.g., in direct physical contact) of the liner layer 410 with the semiconductor layer 130B may cause tensile stress to the channel of the NFET. The stressed channel may lead to performance improvements such as boosted carrier mobility and as such may be desirable. While a nitride liner such as the nitride-containing liner 310 may also cause some stress to the channel of the NFET (had the nitride-containing liner 310 been used for the NFET in place of the oxide-containing liner layer 410), the nitride material may not cause as much stress as the oxide would. In addition, the nitride material may be positively charged. The positive charge may cause the NFET to turn on too easily, which is undesirable. Among other things, if the NFET is turned on too easily, it may induce high leakage. Therefore, it is desirable for the liner layer that is in proximity of the NFET to be neutral (e.g., no charge) or have a negative charge.

For these reasons discussed above, the material composition of the oxide-containing liner layer 410 is configured to cause stress to the channel of the NFET while being neutral or positively charged. The silicon oxide material or aluminum oxide material composition may satisfy these conditions, and as such the oxide-containing liner layer 410 may include silicon oxide, aluminum oxide, or a combination thereof in various embodiments. Note that at the stage of fabrication shown in FIG. 15, a plurality of gaps or trenches 450 exist between the fin structures 295. These gaps or trenches 450 will be filled in a later process discussed below.

Figure 16:
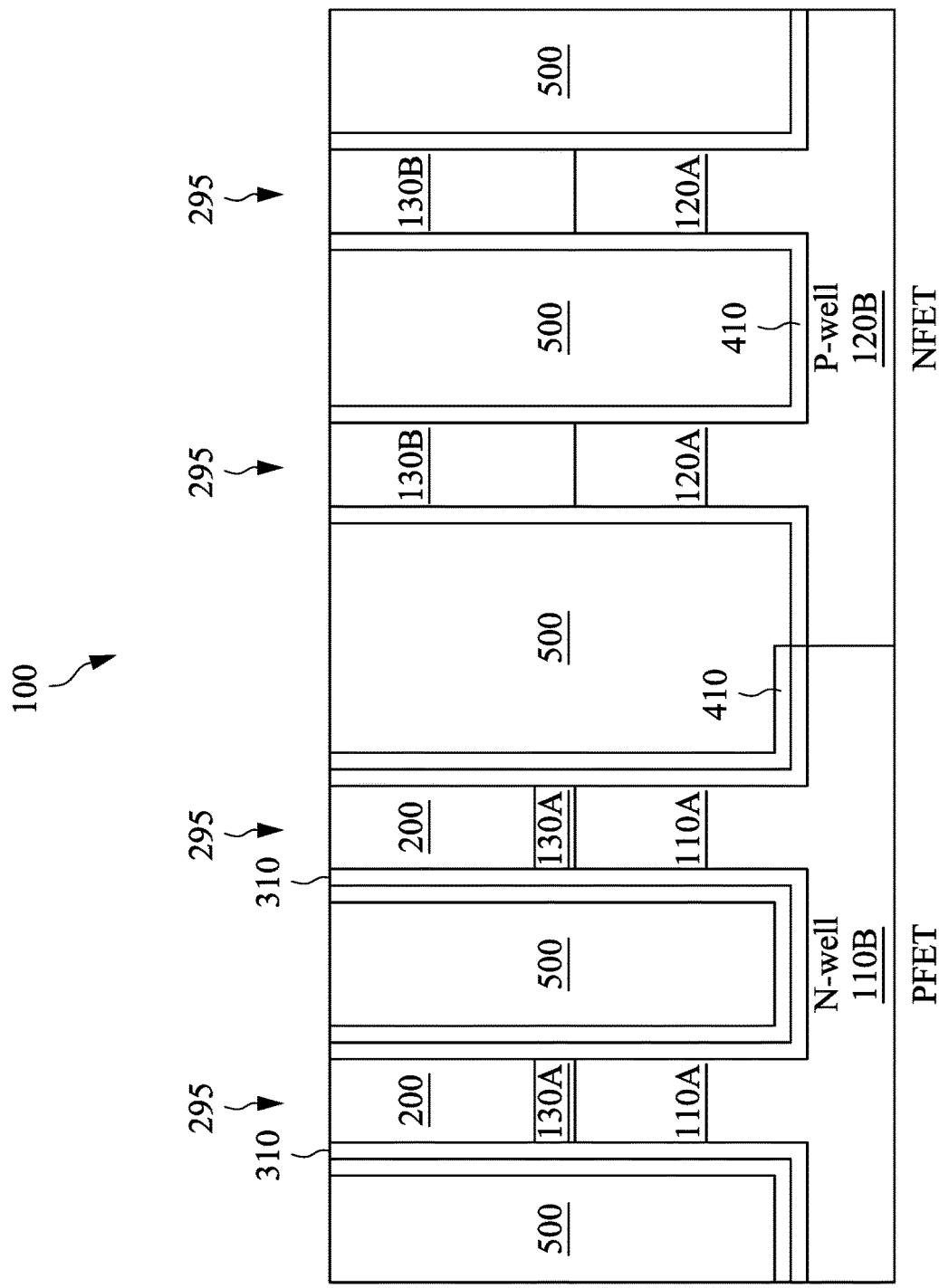

Referring now to FIG. 16, a dielectric isolation structure 500 is formed, for example by a deposition process such as Furnace Chemical Vapor Deposition (FCVD). The dielectric isolation structure 500 is formed to fill the gaps or trenches 450 between the fin structures 295. The dielectric isolation structure 500 may include a shallow-trench-isolation (STI) in some embodiments. The dielectric isolation structure 500 may include an oxide material, for example silicon oxide. Before or after the formation of the dielectric isolation structure 500, a polishing process such as a CMP process may be performed to remove the dielectric layers 270 and 280 (as well as portions of the dielectric isolation structure 500). The polishing process may also remove the capping layer 230 in the fin structures 295 for the PFET.

Figure 17:
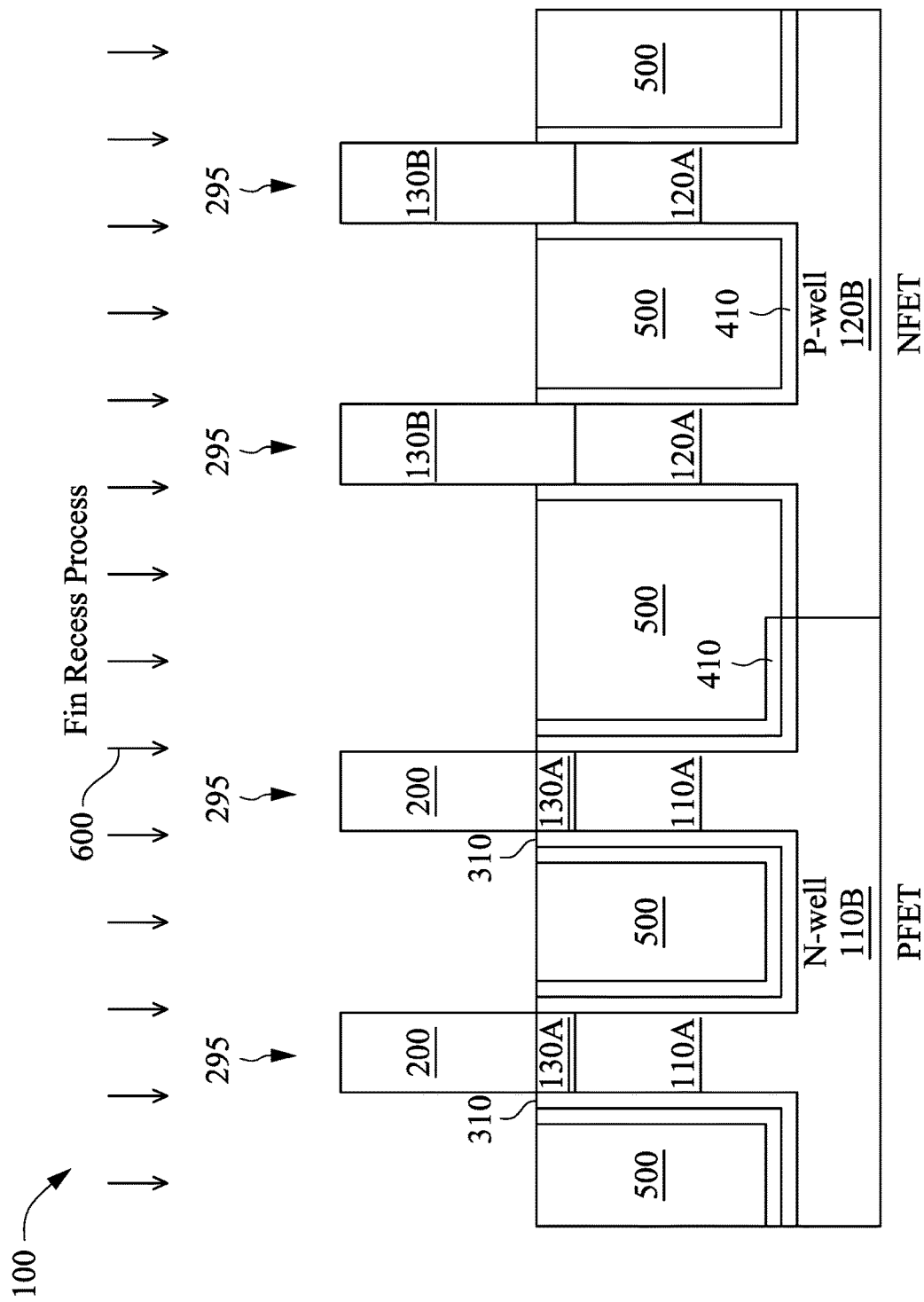

Referring now to FIG. 17, a fin recess process 600 is performed to the FinFET device 100 to selectively remove portions of the oxide-containing liner layer 410 for both the PFET and the NFET, as well as to selectively remove portions of the nitride-containing liner layer 310 for the PFET. In more detail, the portions of the oxide-containing liner layer 410 are removed for the NFET such that the semiconductor layer 130B is exposed, including its upper surface and its sidewall surfaces. Similarly, the portions of the oxide-containing liner layer 410 as well as portions of the nitride-containing liner layer 310 are removed for the PFET such that the semiconductor layer 200 is exposed, including its upper surface and its sidewall surfaces. Portions of the dielectric isolation structure 500 are also removed as a part of the fin recess process 600, so as to help expose the side surfaces of the semiconductor layers 200 and 130B.

Meanwhile, the fin recess process 600 is configured such that it does not substantially affect the portions of the liner layers 310 and 410 that are not disposed on the semiconductor layers 200 and 130B. For example, after the fin recess process 600 is performed, a segment of the nitride-containing liner layer 310 still remains disposed on the sidewall surfaces of the segments 110A and 130A of the N-well and on the upper surfaces of the segment 110B of the N-well. A segment of the oxide-containing liner layer 410 also remains disposed on the nitride-containing liner layer 310 in the PFET. For the NFET, another segment of the oxide-containing liner layer 410 remains disposed on the sidewall surfaces of the segment 120A of the P-well and on the upper surfaces of the segment 120B of the P-well. The oxide-containing liner layer 410 surrounds the side and bottom surfaces of the dielectric isolation structure 500 in the cross-sectional view of FIG. 17. Since the present disclosure utilizes different liner layers for the NFET and the PFET, it may be said that the FinFET device 100 of the present disclosure is a "dual-liner" device.

In some embodiments, the fin recess process 600 includes one or more etching processes, such as dry etching, wet etching, reactive ion etching (RIE), etc. Various etching parameters can be tuned to selectively etch away a desired amount (for example, just enough to expose the semiconductor layers 200 and 130B) of the liner layers 310 and 410. These etching parameters may include, but are not limited to: etchant composition, etching temperature, etching solution concentration, etching time, etching pressure, source power, RF (radio-frequency) bias voltage, RF bias power, etchant flow rate, or combinations thereof.

Figure 18:
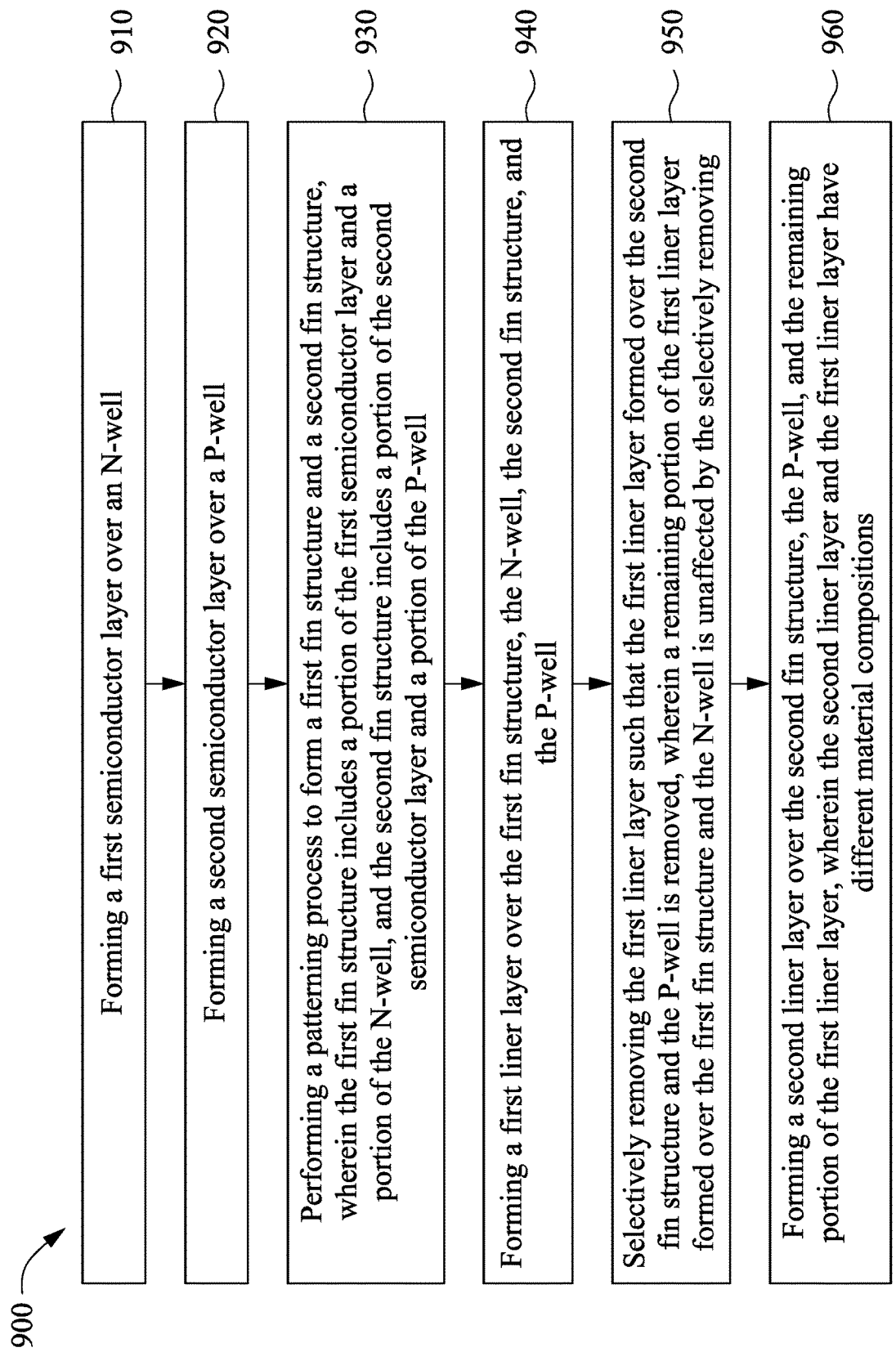
FIG. 18 is a flowchart of a method for fabricating a FinFET device in accordance with embodiments of the present disclosure.

FIG. 18 is a flowchart of a method 900 for fabricating a FinFET device in accordance with various aspects of the present disclosure. The method 900 includes a step 910 of forming a first semiconductor layer over an N-well. In some embodiments, the forming of the first semiconductor layer comprises epitaxially growing silicon germanium as the first semiconductor layer over the N-well.

The method 900 includes a step 920 of forming a second semiconductor layer over a P-well. In some embodiments, the forming of the second semiconductor layer comprises epitaxially growing silicon as the second semiconductor layer over the P-well. In some embodiments, the second semiconductor layer is formed before the first semiconductor layer. In some embodiments, the epitaxially growing of the silicon is performed such that the silicon is grown over both the N-well and the P-well. In some embodiments, after the forming of the second semiconductor layer but before the forming of the first semiconductor layer, the second semiconductor layer over the N-well is partially removed. The first semiconductor layer is epitaxially grown over a remaining portion of the second semiconductor layer that is located over the N-well after the partially removing of the second semiconductor layer.

The method 900 includes a step 930 of performing a patterning process to form a first fin structure and a second fin structure. The first fin structure includes a portion of the first semiconductor layer and a portion of the N-well, and the second fin structure includes a portion of the second semiconductor layer and a portion of the P-well.

The method 900 includes a step 940 of forming a first liner layer over the first fin structure, the N-well, the second fin structure, and the P-well. In some embodiments, the forming of the first liner layer comprises forming a nitride-containing layer as the first liner layer. In some embodiments, the nitride-containing liner layer includes silicon nitride.

The method 900 includes a step 950 of selectively removing the first liner layer such that the first liner layer formed over the second fin structure and the P-well is removed. A remaining portion of the first liner layer formed over the first fin structure and the N-well is unaffected by the selectively removing.

The method 900 includes a step 960 of forming a second liner layer over the second fin structure, the P-well, and the remaining portion of the first liner layer. The second liner layer and the first liner layer have different material compositions. In some embodiments, the forming of the second liner layer comprises forming an oxide-containing layer as the second liner layer. In some embodiments, the oxide-containing layer includes silicon oxide.

In some embodiments, the method 900 may further include steps of removing portions of the first liner layer and the second liner layer formed over the first semiconductor layer, as well as removing portions of the second liner layer formed over the second semiconductor layer.

It is understood that additional process steps may be performed before, during, or after the steps 910-960 discussed above to complete the fabrication of the semiconductor device. For example, the method 900 may further perform processes to form gate structures. The gate structures may be formed using either a "gate-first" or a "gate-last" process. The method 900 may further include steps of forming source/drain features, as well as forming an interlayer dielectric (ILD) layer. Furthermore, an interconnect structure including conductive contacts, vias, and interconnect lines may be formed. Additionally, testing and packaging steps may be performed to complete the fabrication of an integrated circuit.

Based on the above discussions, it can be seen that the present disclosure offers advantages over conventional FinFET and the fabrication thereof. It is understood, however, that other embodiments may offer additional advantages, and not all advantages are necessarily disclosed herein, and that no particular advantage is required for all embodiments.

One advantage is that, through the use of a nitride-containing liner, the present disclosure can reduce or prevent the undesirable oxidation of a silicon germanium material in the fin of the PFET. Another advantage is that, through the use of an oxide-containing liner, the present disclosure can add stress to the channel of the NFET. The oxide-containing liner also does not have a positive charge, which means that the NFET is not too easily turned on. For these reasons, the FinFET device performance is improved. In addition, the various aspects of the present disclosure are compatible with current fabrication process flow and are easy to implement.

One embodiment of the present disclosure involves a semiconductor device. The semiconductor device includes a P-type Field Effect Transistor (PFET) that includes: an N-well disposed in a substrate; a first fin structure disposed over the N-well; a first liner layer disposed over the N-well; and a second liner layer disposed over the first liner layer, wherein the first liner layer and the second liner layer include different materials. The semiconductor device also includes an N-type Field Effect Transistor (NFET) that includes: a P-well disposed in the substrate; a second fin structure disposed over the P-well; and a third liner layer disposed over the P-well, wherein the third liner layer and the second liner layer include same materials. In some embodiments, the first fin structure includes a silicon germanium layer; the second fin structures include a silicon layer; the first liner layer includes a material configured to prevent the silicon germanium layer from being oxidized; and the second liner layer includes a material configured to provide stress to the NFET. In some embodiments, the first liner layer includes a nitride-containing material; the second liner layer includes an oxide-containing material; and the third liner layer includes the oxide-containing material. In some embodiments, the first liner layer includes silicon nitride; and the second liner layer and the third liner layer each include silicon oxide. In some embodiments, no portion of the first liner layer and the second liner layer is disposed on sidewalls of the silicon germanium layer; and no portion of the third liner layer is disposed on sidewalls of the silicon layer. In some embodiments, a portion of the first liner layer is disposed on a side surface of the N-well; and a portion of the second liner layer is disposed on a side surface of the P-well. In some embodiments, the semiconductor device further includes: a dielectric isolation structure located between the PFET and the NFET, wherein the dielectric isolation structure is surrounded by the second liner layer and the third liner layer in a cross-sectional side view.

Another embodiment of the present disclosure involves a FinFET device. The FinFET device includes a P-type Field Effect Transistor (PFET) that includes: an N-well formed in a substrate, wherein the N-well includes a first portion and a second portion that protrudes out of the first portion; a first semiconductor layer located over the second portion of the N-well, wherein the first semiconductor layer includes silicon germanium; a first liner layer located over the N-well but not over the first semiconductor layer, wherein the first liner layer includes a material that prevents an oxidation of the silicon germanium; and a first segment of a second liner layer located over the first liner layer, wherein the second liner layer includes a material that causes stress to silicon. The FinFET device also includes an N-type Field Effect Transistor (NFET) that includes: a P-well formed in the substrate, wherein the P-well includes a first portion and a second portion that protrudes out of the first portion; a second semiconductor layer located over the second portion of the P-well, wherein the second semiconductor layer includes silicon; and a second segment of the second liner layer located over the P-well but not over the second semiconductor layer. In some embodiments, the first liner layer includes a silicon nitride, and the first segment and the second segment of the second liner layer each include silicon oxide. In some embodiments, the first liner layer is in direct physical contact with a sidewall of the first portion of the N-well, and the second segment of the second liner layer is in direct physical contact with a sidewall of the first portion of the P-well. In some embodiments, the FinFET device further includes: a dielectric isolation structure located between the PFET and the NFET. The dielectric isolation structure is in direct physical contact with both the first segment and the second segment of the second liner layer.

Another embodiment of the present disclosure involves a method of fabricating a semiconductor device. The method includes: forming a first semiconductor layer over an N-well; forming a second semiconductor layer over a P-well; performing a patterning process to form a first fin structure and a second fin structure, wherein the first fin structure includes a portion of the first semiconductor layer and a portion of the N-well, and the second fin structure includes a portion of the second semiconductor layer and a portion of the P-well; forming a first liner layer over the first fin structure, the N-well, the second fin structure, and the P-well; selectively removing the first liner layer such that the first liner layer formed over the second fin structure and the P-well is removed, wherein a remaining portion of the first liner layer formed over the first fin structure and the N-well is unaffected by the selectively removing; and after the selectively removing of the first liner layer, forming a second liner layer over the second fin structure, the P-well, and the remaining portion of the first liner layer, wherein the second liner layer and the first liner layer have different material compositions. In some embodiments, the method further includes steps of removing portions of the first liner layer and the second liner layer formed over the first semiconductor layer and removing portions of the second liner layer formed over the second semiconductor layer. In some embodiments, the forming of the first liner layer comprises forming a nitride-containing layer as the first liner layer. In some embodiments, the nitride-containing layer includes silicon nitride. In some embodiments, the forming of the second liner layer comprises forming an oxide-containing layer as the second liner layer. In some embodiments, the oxide-containing layer includes silicon oxide. In some embodiments, the forming of the first semiconductor layer comprises epitaxially growing silicon germanium as the first semiconductor layer over the N-well; and the forming of the second semiconductor layer comprises epitaxially growing silicon as the second semiconductor layer over the P-well. In some embodiments, the second semiconductor layer is formed before the first semiconductor layer; and the epitaxially growing of the silicon is performed such that the silicon is grown over both the N-well and the P-well. In some embodiments, the method further includes steps of: after the forming of the second semiconductor layer but before the forming of the first semiconductor layer, partially removing the second semiconductor layer over the N-well, wherein the first semiconductor layer is epitaxially grown over a remaining portion of the second semiconductor layer that is located over the N-well after the partially removing of the second semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, the method comprising:
   forming a first fin structure over an N-well and forming a second fin structure over a P-well, wherein the second fin structure includes a first type of semiconductor material, and wherein the first fin structure includes the first type of semiconductor material and a second type of semiconductor material;
   forming a first liner layer over the first fin structure and over the second fin structure;
   forming a mask layer over a first portion of the first liner layer that is disposed over the first fin structure;
   removing a second portion of the first liner layer that is disposed over the second fin structure;
   removing the mask layer after the removing of the second portion of the first liner layer;
   forming a second liner layer over the first portion of the first liner layer, the second fin structure, and the P-well, wherein the second liner layer contains a different material than the first liner layer;
   forming an isolation structure around the first fin structure and the second fin structure; and
   partially etching the isolation structure to partially expose side surfaces of the first fin structure and the second fin structure, wherein the partially etching includes etching away portions of the first liner layer disposed on sidewalls of the first fin structure such that the second type of semiconductor material is exposed but the first type of semiconductor material is not exposed.

2. The method of claim 1, wherein one of the first and second liner layers contains oxide, and wherein another one of the first and second liner layers contains nitride.

3. The method of claim 2, wherein the first liner layer includes silicon nitride, and wherein the second liner layer includes silicon oxide or aluminum oxide.

4. The method of claim 1, wherein the partially etching is performed until an upper surface of the isolation structure is substantially co-planar with an upper surface of the first type of semiconductor material of the first fin structure.

5. The method of claim 1, wherein:
   the first type of semiconductor material is silicon; and
   the second type of semiconductor material is silicon germanium.

6. The method of claim 1, wherein the forming of the first fin structure and the second fin structure comprises:
   forming a semiconductor layer over the N-Well and over the P-well;
   forming a protective layer over the semiconductor layer disposed over the P-well;
   partially removing a first portion the semiconductor layer disposed over the N-well while a second portion of the semiconductor layer disposed over the P-well is being protected by the protective layer, wherein a remaining third portion of the semiconductor layer forms the first type of semiconductor material of the first fin structure;

growing the second type of semiconductor material of the first fin structure over the first type of semiconductor material of the first fin structure; and removing the protective layer.

7. The method of claim 6, wherein the forming of the first fin structure and the second fin structure further comprises:

forming a semiconductor capping layer over the second type of semiconductor material disposed over the N-well and over the first type of semiconductor material disposed over the P-well;

forming one or more dielectric layers over the semiconductor capping layer; and performing one or more patterning processes to the one or more dielectric layers, the semiconductor capping layer, the first type of semiconductor material, and the second type of semiconductor material, thereby defining the first fin structure and the second fin structure.

8. The method of claim 1, wherein:

the forming the first liner layer comprises forming the first liner layer having a first thickness in a range between about 2 nanometers and about 5 nanometers; and the forming the second liner layer comprises forming the second liner layer having a second thickness in a range between about 2 nanometers and about 5 nanometers.

9. A method of fabricating a semiconductor device, the method comprising:

forming a first fin structure over a first type of doped well, wherein the first fin structure includes a first segment containing a first type of semiconductor material and a second segment containing a second type of semiconductor material that is different from the first type of semiconductor material, and wherein the second type of semiconductor material is located over the first type of semiconductor material;

forming a second fin structure over a second type of doped well, wherein the second fin structure includes the first type of semiconductor material but not the second type of semiconductor material, and wherein the first type of doped well and the second type of doped well are doped differently;

forming one or more liner layers over the first fin structure and the second fin structure, wherein the first fin structure has an extra liner formed thereon compared to the second fin structure, wherein the forming of the one or more liner layers comprises:

depositing a nitride-containing liner layer over both the first fin structure and the second fin structure;

removing a portion of the nitride-containing liner layer deposited over the second fin structure; and after the removing, depositing an oxide-containing liner layer over the nitride-containing liner layer and over the second fin structure;

forming an isolation structure between the first fin structure and the second fin structure, wherein the isolation structure is formed over the one or more liner layers; and etching the isolation structure and the one or more liner layers until an upper surface of the isolation structure is substantially co-planar with an interface between the first segment and the second segment of the first fin structure.

10. The method of claim 9, wherein:
the first type of doped well is an N-well; and
the second type of doped well is a P-well.

11. The method of claim 9, wherein the first type of doped well and the second type of doped well are each formed to protrude vertically over a substrate.

12. The method of claim 9, wherein the first fin structure is formed such that the first segment contains silicon as the first type of semiconductor material and the second segment contains silicon germanium as the second type of semiconductor material.

13. The method of claim 9, wherein the etching exposes a portion, but not all, of sidewalls of the second fin structure.

14. The method of claim 9, wherein:

each of the one or more liner layers is formed by a respective deposition process; and at least the nitride-containing liner layer is formed over both side surfaces and upper surfaces of the first fin structure and the second fin structure.

15. A method of fabricating a semiconductor device, the method comprising:

forming a second semiconductor layer over a P-well, including epitaxially growing silicon as the second semiconductor layer over an N-well and a P-well;

partially removing the second semiconductor layer over the N-well;

forming a first semiconductor layer over the N-well, including epitaxially growing silicon germanium as the first semiconductor layer over the N-well, wherein the first semiconductor layer is epitaxially grown over a remaining portion of the second semiconductor layer that is located over the N-well after the partially removing of the second semiconductor layer;

performing a patterning process to form a first fin structure and a second fin structure, wherein the first fin structure includes a portion of the first semiconductor layer and a portion of the N-well, and the second fin structure includes a portion of the second semiconductor layer and a portion of the P-well;

forming a first liner layer over the first fin structure, the N-well, the second fin structure, and the P-well;

selectively removing the first liner layer such that the first liner layer formed over the second fin structure and the P-well is removed, wherein a remaining portion of the first liner layer formed over the first fin structure and the N-well is unaffected by the selectively removing; and after the selectively removing of the first liner layer, forming a second liner layer over the second fin structure, the P-well, and the remaining portion of the first liner layer, wherein the second liner layer and the first liner layer have different material compositions.

16. The method of claim 15, further comprising:

removing portions of the first liner layer and the second liner layer formed over the first semiconductor layer; and removing portions of the second liner layer formed over the second semiconductor layer.

17. The method of claim 15, wherein the forming of the first liner layer comprises forming a nitride-containing layer as the first liner layer.

18. The method of claim 17, wherein the nitride-containing layer includes silicon nitride.

19. The method of claim 15, wherein the forming of the second liner layer comprises forming an oxide-containing layer as the second liner layer.

20. The method of claim 19, wherein the oxide-containing layer includes silicon oxide or aluminum oxide.

* * * * *